United States Patent
Lin et al.

(10) Patent No.: US 11,968,828 B2
(45) Date of Patent: Apr. 23, 2024

(54) METHOD OF FORMING A SEMICONDUCTOR DEVICE WITH A DUAL GATE DIELECTRIC LAYER HAVING MIDDLE PORTION THINNER THAN THE EDGE PORTIONS

(71) Applicant: TAIWAN SEMICONDUCTOR MANUFACTURING CO., LTD., Hsinchu (TW)

(72) Inventors: Meng-Han Lin, Hsinchu (TW); Wen-Tuo Huang, Tainan (TW); Yong-Shiuan Tsair, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 311 days.

(21) Appl. No.: 16/506,823

(22) Filed: Jul. 9, 2019

(65) Prior Publication Data

US 2021/0013220 A1    Jan. 14, 2021

(51) Int. Cl.
| | | |
|---|---|---|
| H01L 29/66 | (2006.01) |
| H01L 21/28 | (2006.01) |
| H01L 21/762 | (2006.01) |
| H01L 29/06 | (2006.01) |
| H01L 29/423 | (2006.01) |
| H01L 29/788 | (2006.01) |
| H10B 41/30 | (2023.01) |
| H10B 41/40 | (2023.01) |
| H10B 41/42 | (2023.01) |

(52) U.S. Cl.
CPC ....... *H10B 41/42* (2023.02); *H01L 21/76229* (2013.01); *H01L 29/0649* (2013.01); *H01L 29/40114* (2019.08); *H01L 29/42368* (2013.01); *H01L 29/66545* (2013.01); *H01L 29/66825* (2013.01); *H01L 29/7883* (2013.01); *H10B 41/30* (2023.02); *H10B 41/40* (2023.02)

(58) Field of Classification Search
CPC ......... H01L 27/11531; H01L 29/42368; H01L 29/66545
See application file for complete search history.

(56) References Cited

U.S. PATENT DOCUMENTS

| | | | |
|---|---|---|---|
| 6,417,052 B1 * | 7/2002 | Tsujikawa | H01L 29/94 257/E29.345 |
| 6,548,363 B1 | 4/2003 | Wu et al. | |
| 6,551,883 B1 * | 4/2003 | Yen | H01L 21/28114 257/E21.193 |
| 7,432,163 B2 * | 10/2008 | Yajima | H01L 21/823481 257/E21.628 |

(Continued)

*Primary Examiner* — Anh D Mai
(74) *Attorney, Agent, or Firm* — Maschoff Brennan

(57) ABSTRACT

A semiconductor device is provided. The semiconductor device includes a semiconductor substrate and a first gate stack. An isolation feature is formed in the semiconductor substrate, and a cell region and a peripheral region adjacent to the cell region are defined in the semiconductor substrate. The first gate stack is disposed on the peripheral region of the semiconductor substrate. The first gate stack includes a first dielectric layer and a gate electrode layer disposed on the first dielectric layer and covering a top surface of the first dielectric layer. The first dielectric layer is disposed on the semiconductor substrate and has a concave profile.

20 Claims, 38 Drawing Sheets

(56) References Cited

U.S. PATENT DOCUMENTS

| | | | |
|---|---|---|---|
| 2015/0072489 A1* | 3/2015 | Baker, Jr. | H01L 27/11546 438/267 |
| 2015/0287797 A1* | 10/2015 | Yu | H01L 29/6659 257/336 |
| 2016/0005756 A1* | 1/2016 | Chuang | H01L 29/665 257/314 |
| 2019/0035799 A1* | 1/2019 | Shu | H01L 27/11573 |
| 2019/0165115 A1* | 5/2019 | Lin | H01L 27/1157 |

\* cited by examiner

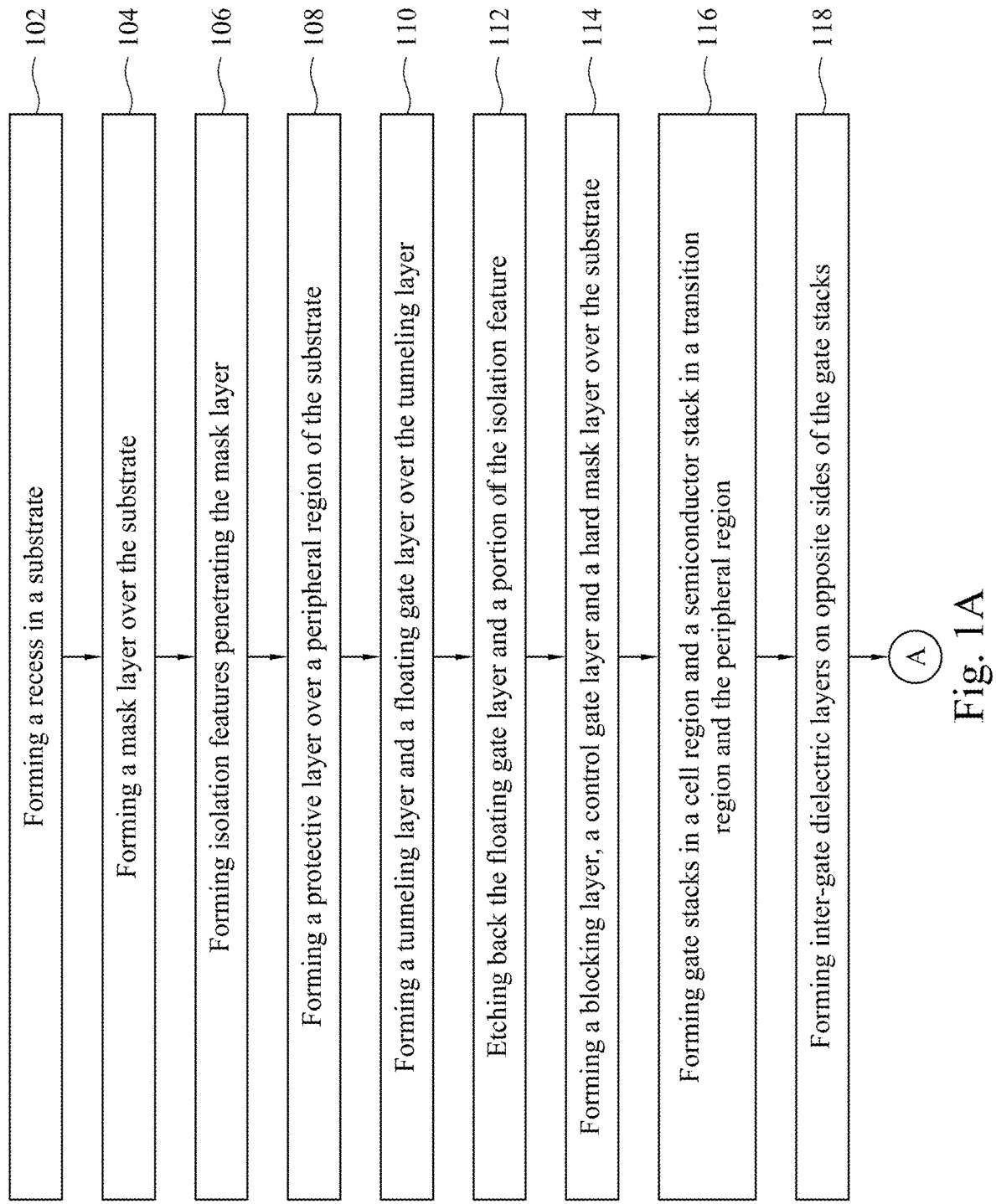

METHOD OF FORMING A SEMICONDUCTOR DEVICE WITH A DUAL GATE DIELECTRIC LAYER HAVING MIDDLE PORTION THINNER THAN THE EDGE PORTIONS

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1D are a flow chart of a method for manufacturing a semiconductor device at different stages in accordance with some embodiments.

DETAILED DESCRIPTION

Figure 1B:
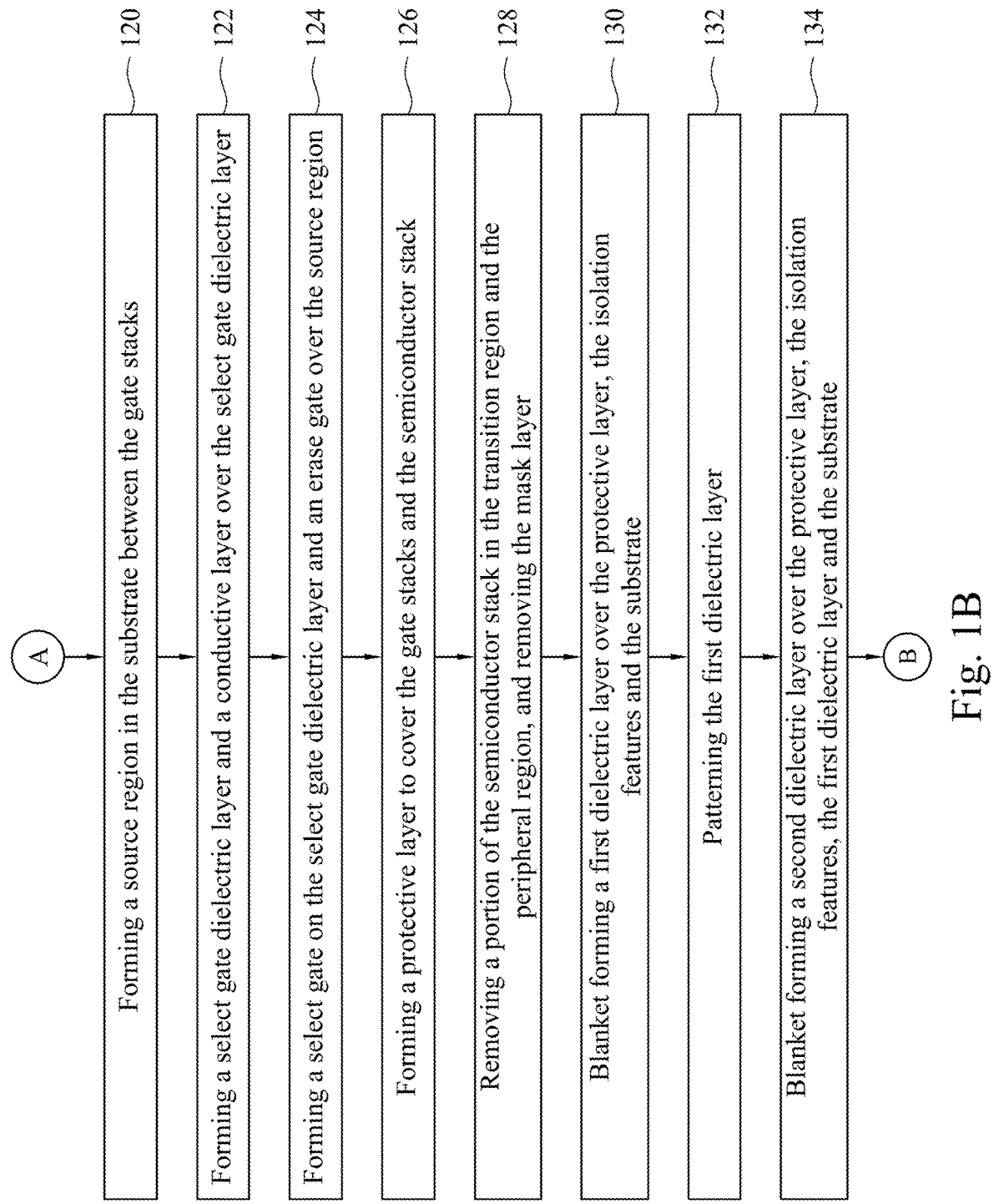

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flash memory can be formed on a bulk silicon substrate and uses various bias conditions to read and write data values. For example, an ESF3 cell—or so-called "third generation SUPERFLASH" cell—includes a pair of symmetric split gate memory cells, each of which includes a pair of source/drain regions with a channel region arranged there between. In the ESF3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the ESF3 cell and a sidewall of the floating and/or control gate). At least one cell is configured to store a variable charge level on its floating gate, wherein the level of this charge corresponds to a data state stored in the cell and is stored in a non-volatile manner so that the stored charge/data persists in the absence of power.

By changing the amount of charge stored on the floating gate, the threshold voltage $V_{th}$ of the memory cell device can be correspondingly changed. For example, to perform a program operation (e.g., write a logical "0", program is 0, Vt high) for a cell, the control gate is biased with a high (e.g., at least an order of magnitude higher) voltage relative a voltage applied across the channel region and/or relative to a voltage applied to the select gate. The high bias voltage promotes Fowler-Nordheim tunneling of carriers from the channel region towards the control gate. As the carriers tunnel towards the control gate, the carriers become trapped in the floating gate and alter the $V_{th}$ of the cell. Conversely, to perform an erase operation (e.g., write a logical "1", erase is 1, Vt low) for the cell, the erase gate is biased with a high (e.g., at least an order of magnitude higher) voltage relative a voltage applied across the channel region and/or relative to a voltage applied to the control gate. The high bias voltage promotes Fowler-Nordheim tunneling of carriers from the floating gate towards the erase gate, thereby removing carriers from the floating gate and again changing the $V_{th}$ of the cell in a predictable manner. Subsequently, during a read operation, a voltage is applied to the select gate to induce part of the channel region to conduct. Application of a voltage to the select gate attracts carriers to part of the channel region adjacent to the select gate. While the select gate voltage is applied, a voltage greater than $V_{th}$, but less than $V_{th}+\Delta V_{th}$, is applied to the control gate (where $\Delta V_{th}$ is a change in $V_{th}$ due to charge trapped on the floating gate). If the memory cell device turns on (i.e., allows charge to flow), then it is deemed to contain a first data state (e.g., a logical "1" is read). If the memory cell device does not turn on, then it is deemed to contain a second data state (e.g., a logical "0" is read).

With scaling down in a dimension of a semiconductor device, a spacer width of a gate structure of the semiconductor device is also scaled down. The insufficient width of spacers may cause more overlay between source/drain regions and the gate structure, which leads to a problem of a gate-induced drain leakage (GIDL) current for a semiconductor device (e.g., a high voltage device of a semiconductor memory device) operated in a higher voltage than the other semiconductor device (e.g., a core and I/O device of the semiconductor memory device). Typically, a dual spacer process is performed to reduce the GIDL, but the process is complicated and may significantly affect performance of the core device, for example, a low yield may be caused. There is another method provided for reducing the GIDL. In such method, a patterned polycrystalline silicon gate electrode is formed over a silicon oxide gate insulation layer, followed by performing a thermal oxidizing operation, such that thicker silicon oxide layer is formed at edges of the gate electrode. Nevertheless, the thermal oxidizing operation performed under a high temperature may cause crystallization of high dielectric constant (high-k) gate dielectric layer, increasing a risk of current leakage in the gate structure.

Embodiments of the present disclosure are directed to providing a semiconductor device and a method of forming the semiconductor device. A gate dielectric layer of a high voltage device is thickened at edge portions, such that the gate dielectric layer has a concave profile. In some embodiments, thickening the edge portions of the gate dielectric layer is performed by several times of deposition operations and patterning operations, so that each of the edge portions can have a top surface that is higher than a top surface of a middle portion between these edge portions. The gate dielectric layers of the other devices remain relatively thin and flat. The problem of GIDL is improved by the gate dielectric layer having the concave profile because the thicker edge portions keeps the gate electrode layer distant from the source/drain regions. The improvement in GIDL also reduces high field induced band to band tunneling leakage on the source/drain regions. Furthermore, the thickened edge portions allow overlay between the gate dielectric layer and the source/drain regions, such that a proper saturation drain current ($I_{dsat}$) remains, and reliability of the high voltage device increases. In addition, this process is simple and compatible to the common semiconductor manufacturing process.

FIGS. 1A-1D is a flow chart of a method 100 for manufacturing a semiconductor device at different stages in accordance with some embodiments. FIGS. 2 to 30 are schematic cross-sectional views at different intermediate stages of the method 100 for manufacturing the semiconductor device in accordance with some embodiments. It is understood that additional operations may be implemented before, during, or after the method 100, and some of the operations described may be replaced or eliminated for other embodiments of the method 100.

Figure 2:
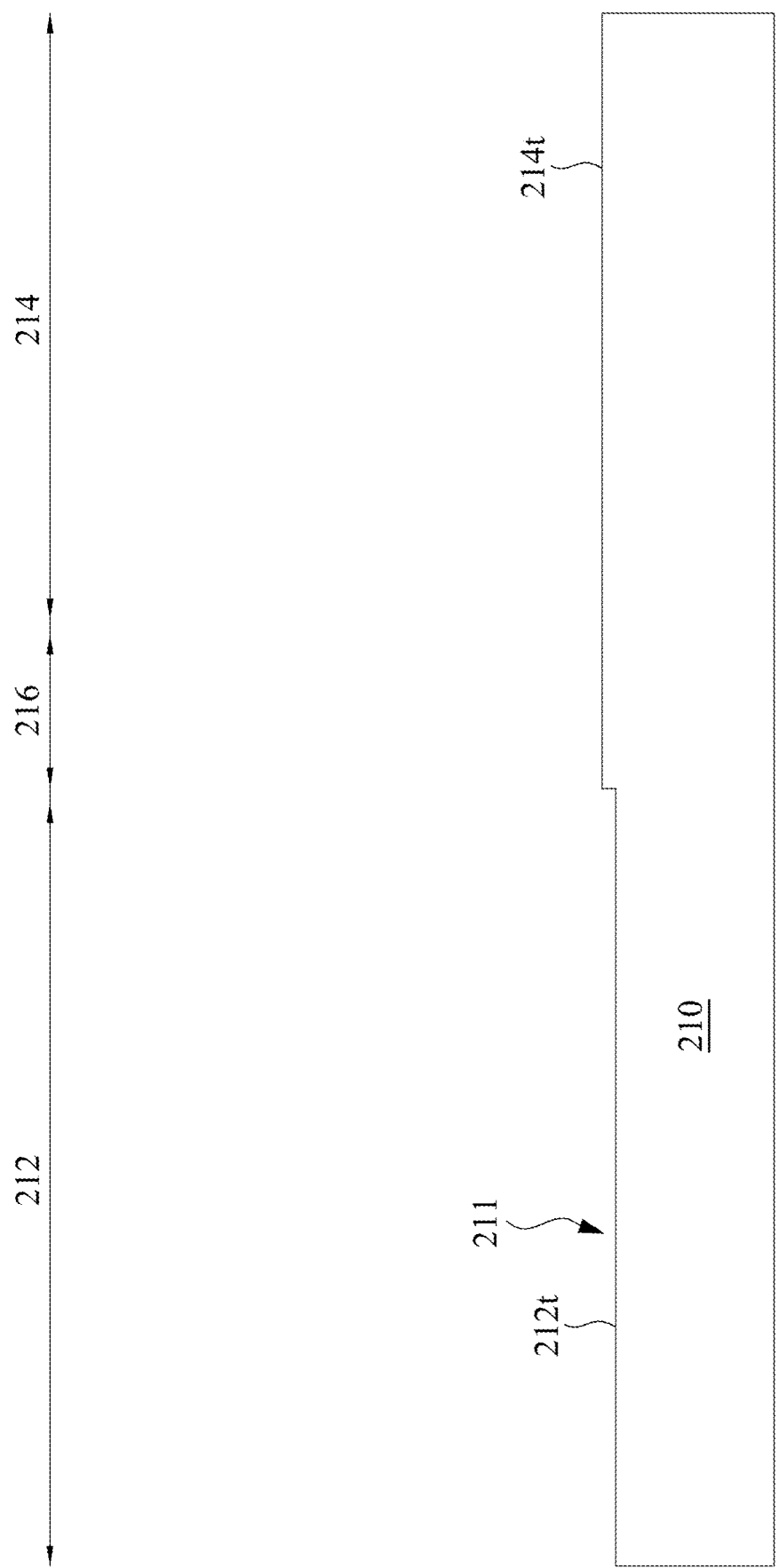
FIG. 2 through FIG. 30 are schematic cross-sectional views at different intermediate stages of the method for manufacturing the semiconductor device in accordance with some embodiments.

Referring to FIG. 1A and FIG. 2, the method 100 begins at operation 102 where a recess 211 is formed over a substrate 210. In some embodiments, the substrate 210 can be a semiconductor substrate, such as a bulk silicon substrate, a germanium substrate, a compound semiconductor substrate, or other suitable substrate. The substrate 210 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 210 includes a cell region 212, a peripheral region 214, and a transition region 216. The peripheral region 214 is located at an edge of the cell region 212. For example, the peripheral region 214 surrounds the cell region 212. The transition region 216 is disposed between the cell region 212 and the peripheral region 214.

The formation of the recess 211 may include forming a patterned pad layer and a patterned mask layer (not shown) over the peripheral region 214 and one portion of the transition region 216. In some embodiments, the pad layer may be formed of dielectric material, such as an oxide layer, and the mask layer may be formed of dielectric material, such as silicon nitride (SiN) or other suitable materials. Then, a surface layer of the exposed region of the substrate 210 not covered by the pad layer is oxidized using, for example, wet oxidation. Thereafter, the oxidized surface layer is removed from the substrate 210 using, for example, wet etching, dry etching, or a combination of wet etching and dry etching. The removal of oxidized surface layer results in the recess 211 in the cell region 212. For example, a top surface 212t of the cell region 212 is lower than a top surface 214t of the peripheral region 214. In some embodiments, the depth of the recess 211 is about 50 Angstroms to about 2000 Angstroms.

Figure 3:
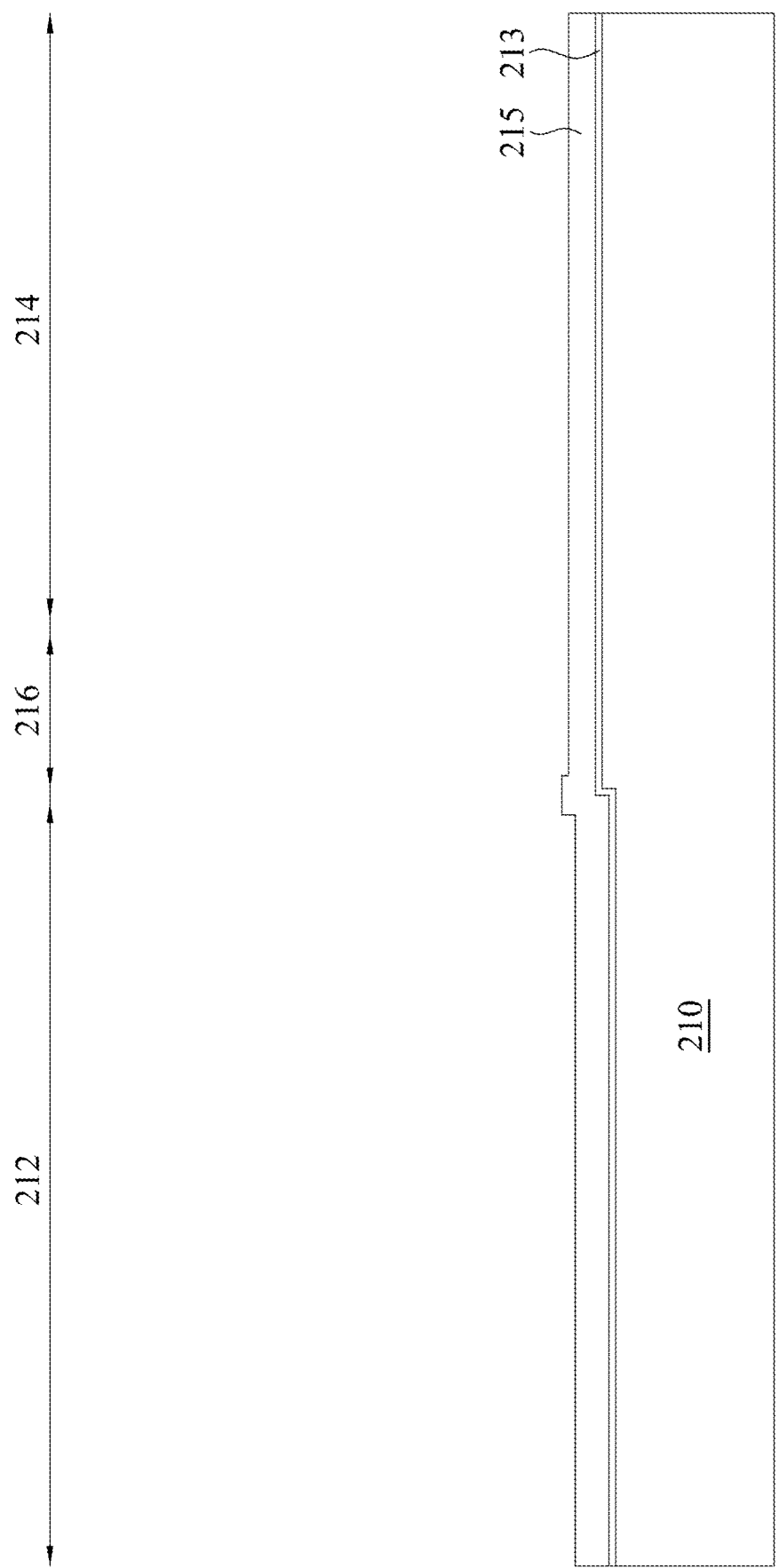

Referring to FIG. 1A and FIG. 3, the method 100 proceeds to operation 104 where a pad layer 213 and a mask layer 215 are conformally formed over the substrate 210 in a sequence. In some embodiments, the pad layer 213 may be formed of dielectric material, such as an oxide layer. The mask layer 215 may be made of silicon nitride or other suitable materials. The mask layer 215 may include a single layer or multiple layers. In some embodiments, the pad layer 213 and the mask layer 215 may be formed using chemical vapor deposition (CVD), physical vapor deposition (PVD), atomic layer deposition (ALD), ozone oxidation, other suitable processes, or combinations thereof. After depositing the mask layer 215, an optional etching process can be performed to etch back a portion of the mask layer 215 over the peripheral region 214. During the etching process, the cell region 212 can be protected by a patterned photoresist.

Figure 4:
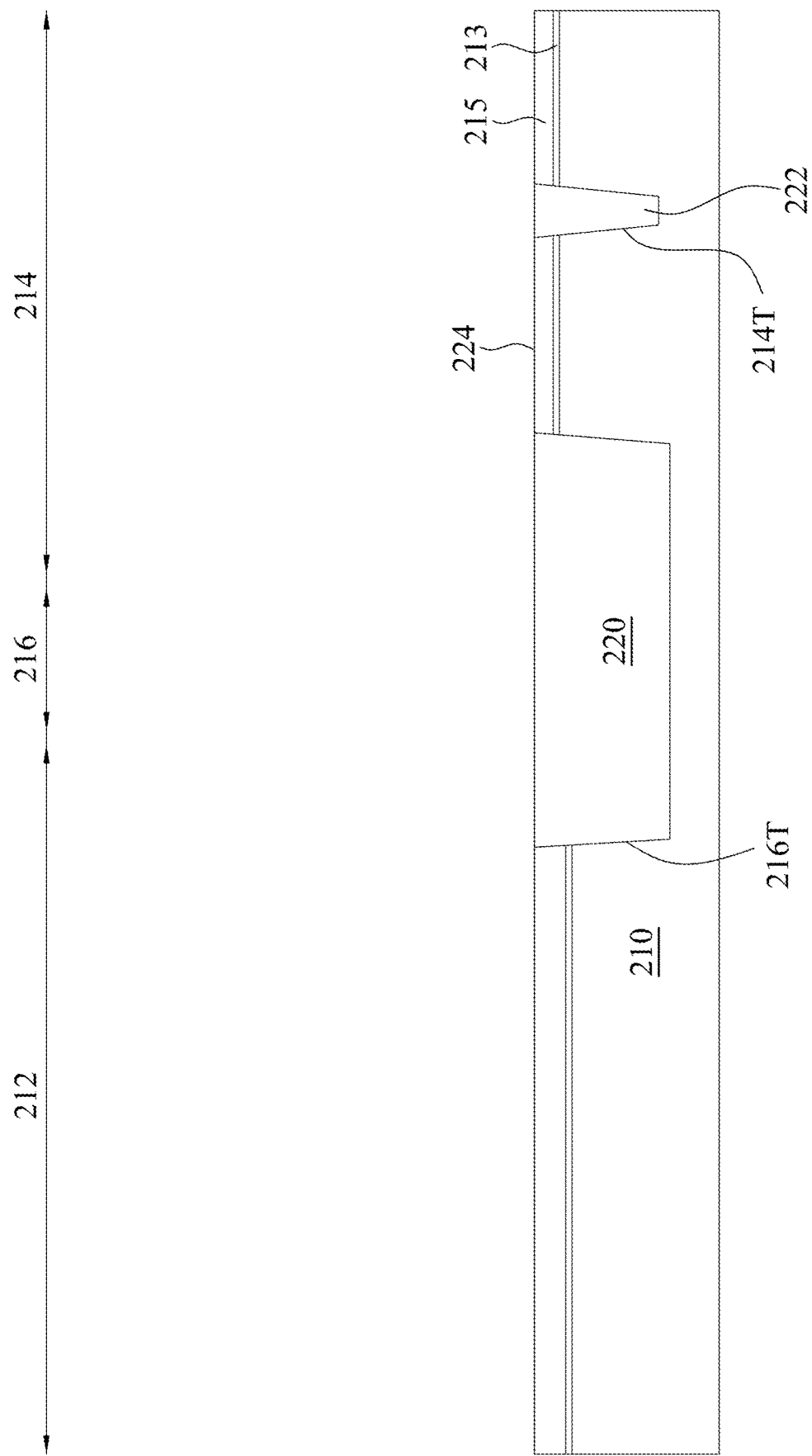

Referring to FIG. 1A and FIG. 4, the method 100 proceeds to operation 106 where isolation features 220 and 222 are formed in the substrate 210 and through the pad layer 213 and the mask layer 215. Specifically, prior to the formation of the isolation features 220 and 222, trenches 214T and 216T are formed in the substrate 210. The trenches 214T and 216T are formed by forming a photoresist over the structure of FIG. 3, the photoresist covering some portions of the mask layer 215 while leaving other regions of the mask layer 215 exposed, performing an etch process to remove the exposed portions of the mask layer 215 so as to pattern the mask layer 215, and performing an etch process to remove portions of the pad layer 213 exposed by the patterned mask 215 and the corresponding portions of the substrate 210 underneath. As such, trenches 214T and 216T are formed. In some embodiments, the trench 214T is formed in the peripheral region 214, and the trench 216T is formed in the transition region 216.

Then, a dielectric material overfills the trenches 214T and 216T. In some embodiments, the dielectric material includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other CVD methods. The formation of the liner oxide reduces the electrical fields and hence improves the performance of the resulting semiconductor device. A chemical mechanical polish (CMP) is then performed to substantially level the top surface of the dielectric material with the top surfaces of the patterned mask 215 to form a plurality of isolation features 220 and 222 in the trenches 214T and 216T. It is noted that the number of the isolation feature 222 can be plural in some other embodiments. The isolation feature 222 is disposed in the peripheral region 214 of the substrate 210, and the isolation feature 220 is at least disposed in the transition region 216 of the substrate 210.

Figure 5:
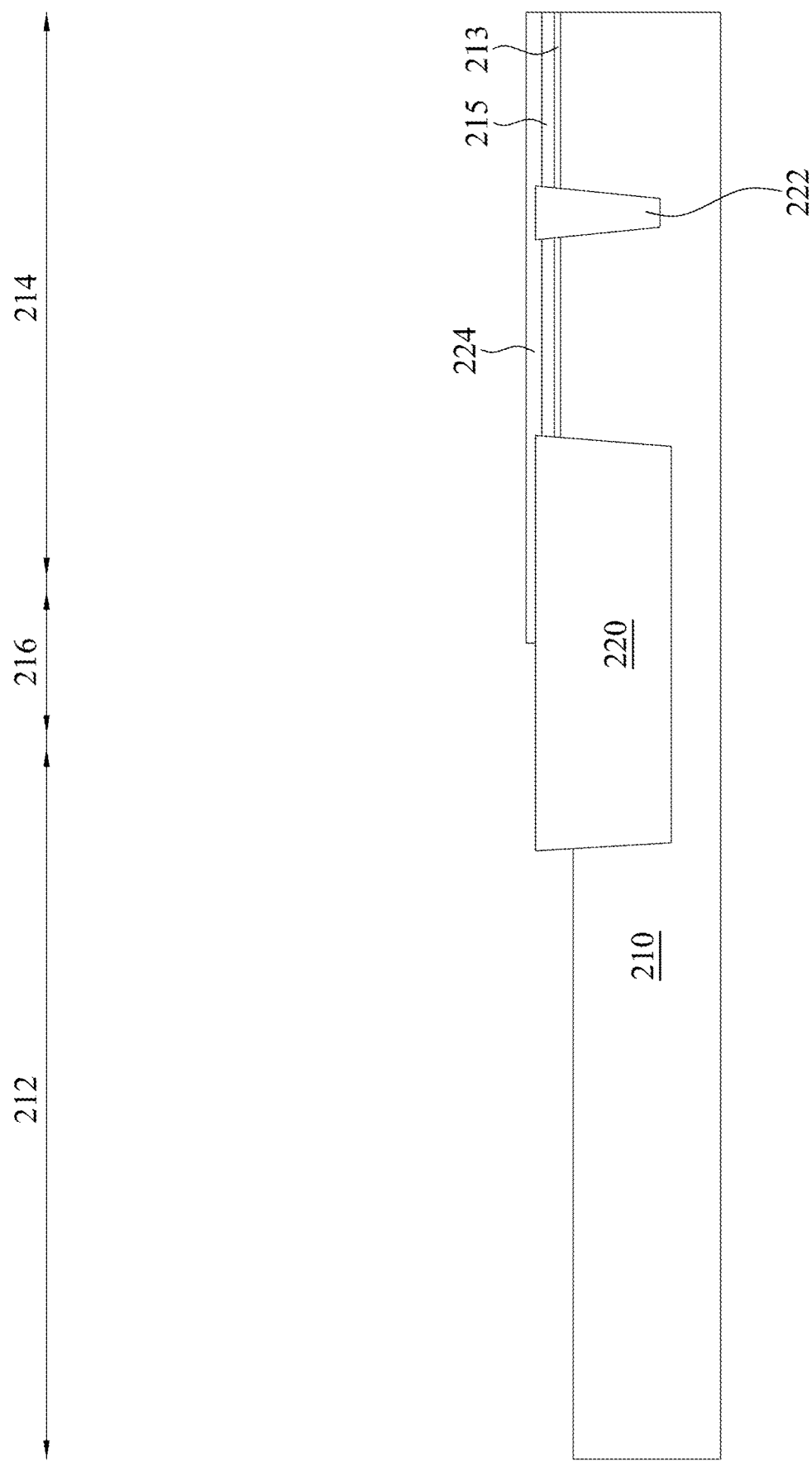

Referring to FIG. 1A and FIG. 5, the method 100 proceeds to operation 108 where a protective layer 224 is formed over the peripheral region 214 of the substrate 210. The protective layer 224 is, for example, made of silicon oxide, silicon nitride, other suitable material, or the combination thereof. Formation of the protective layer 224 includes, for example, depositing a blanket layer of protective material over the substrate 210, followed by patterning the blanket layer to form the protective layer 224 over the peripheral region 214 and not over the cell region 212. The protective layer 224 may cover a portion of a top surface of the isolation feature 220. Afterwards, the pad layer 213 and the mask layer 215 in the cell region 212 exposed by the patterned protective layer 224 are removed using a suitable etching process.

Figure 6:
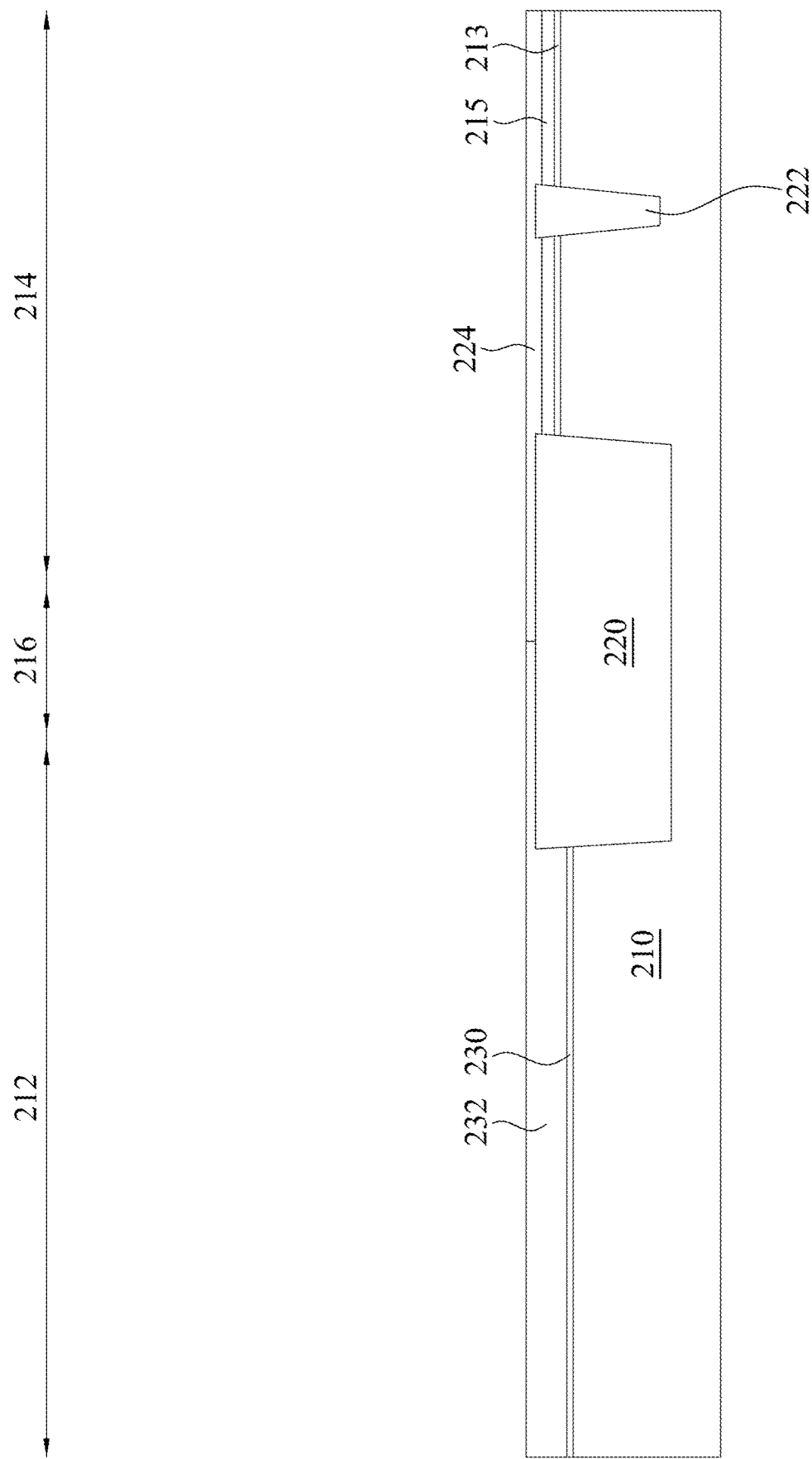

Referring to FIG. 1A and FIG. 6, the method 100 proceeds to operation 110, a tunneling layer 230 is formed over the substrate 210 exposed by the patterned protective layer 224, and a floating gate layer 232 is formed over the tunneling layer 230. The tunneling layer 230 may include, for example, a dielectric material such as silicon dioxide ($SiO_2$), silicon nitride ($Si_3N_4$), silicon oxynitride (SiON), high-k materials, other non-conductive materials, or combinations thereof. The tunneling layer 230 may be formed using thermal oxidation, ozone oxidation, other suitable processes, or combinations thereof. The floating gate layer 232 may include polysilicon formed through, for example low pressure CVD (LPCVD) methods, CVD methods and PVD sputtering methods employing suitable silicon source materials. In some embodiments, the floating gate layer 232 may be ion implanted. In some other embodiments, the floating gate layer 232 may be made of metal, metal alloys, single crystalline silicon, or combinations thereof. For example, a polysilicon layer is conformally formed over the tunneling layer 230, and then a CMP process is performed to remove a portion of the polysilicon layer, such that a remaining portion of the polysilicon layer (i.e. the floating gate layer 232) is planarized until the protective layer 224 is exposed. The protective layer 224 has a higher resistance to the planarization than that of the floating gate layer 232. For example, the protective layer 224 may serve as a CMP stop layer.

Figure 7:
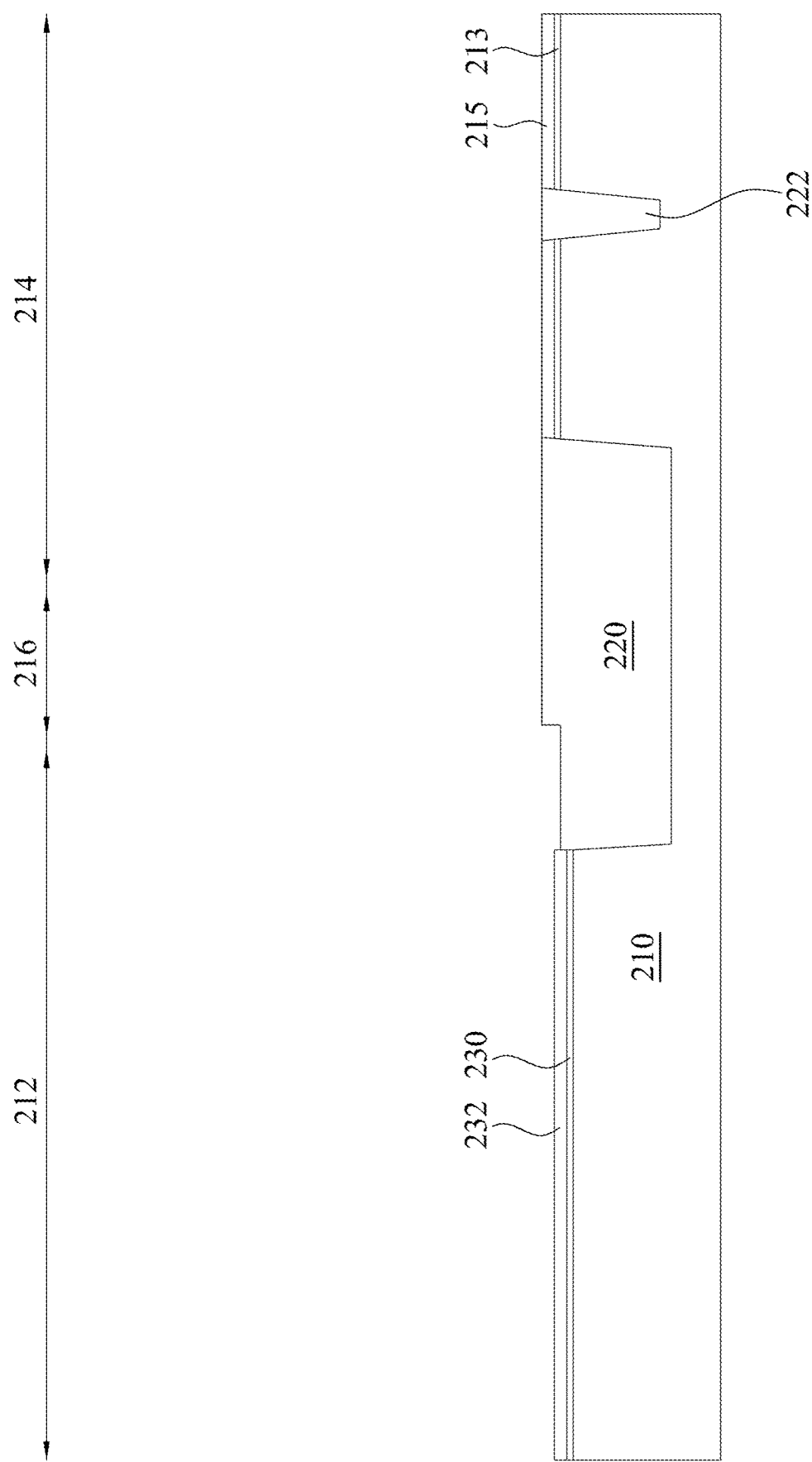

Referring to FIG. 1A and FIG. 7, the method 100 proceeds to operation 112 where an etch back process is performed. Herein, the protective layer 224 (referring to FIG. 6) may have a higher etch resistance to the etch back process than that of the floating gate layer 232 and isolation features 220 and 222. The floating gate layer 232 and a portion of the isolation feature 220 in the cell region 212 are etched, while the protective layer 224 (referring to FIG. 6) remains substantially intact. The etching back may recess a portion of the isolation feature 220 that is not covered by the protective layer 224, thus resulting in a notched corner on the isolation feature 220. Herein, the floating gate layer 232 may have an etch resistance to the etch back process higher than that of the isolation feature 220, such that after the etching back, the floating gate layer 232 has a top surface higher than that of the recessed portion of the isolation feature 220. After the etching back, the protective layer 224 (referring to FIG. 6) is removed by a suitable etching process.

Figure 8:
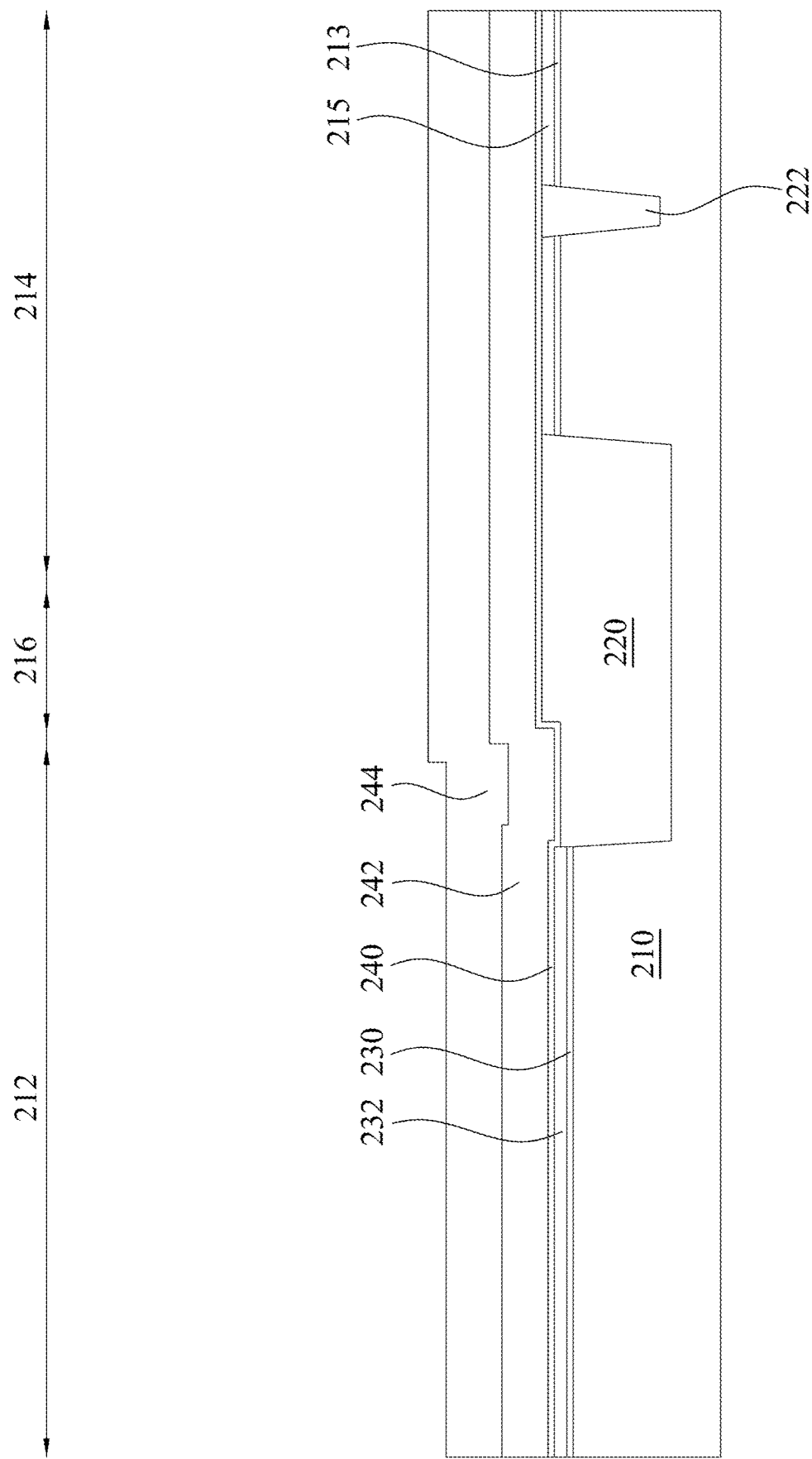

Referring to FIG. 1A and FIG. 8, the method 100 proceeds to operation 114 where a blocking layer 240, a control gate layer 242, and a hard mask layer 244 are formed over the substrate 210. The blocking layer 240 is conformally formed over the floating gate layer 232, the isolation feature 220 and the mask layer 215. In some embodiments, the blocking layer 240 and the tunneling layer 230 may have the same materials. In other embodiments, the blocking layer 240 and the tunneling layer 230 have different materials. That is, the blocking layer 240 may include, for example, a dielectric material such as silicon dioxide ($SiO_2$), silicon nitride ($Si_3N_4$), oxynitrides (SiON), high-k materials, other non-conductive materials, or combinations thereof. The blocking layer 240 may be formed using chemical vapor deposition (CVD), physical vapor deposition (PVD), atomic layer deposition (ALD), ozone oxidation, other suitable processes, or combinations thereof.

The control gate layer 242 is conformally formed over the blocking layer 240. The control gate layer 242 may include polysilicon formed through, for example low pressure CVD (LPCVD) methods, CVD methods and PVD sputtering methods employing suitable silicon source materials. In some embodiments, the control gate layer 242 may be ion implanted. In some other embodiments, the control gate layer 242 may be made of metal, metal alloys, single crystalline silicon, or combinations thereof. In some embodiments, the control gate layer 242 is thicker than the floating gate layer 232.

The hard mask layer 244 is conformally formed over the control gate layer 242. The hard mask layer 244 may include single layer or multiple layers. In some embodiments, the hard mask layer 244 includes $SiN/SiO_2/SiN$ stacked layers or other suitable materials. In some embodiments, the hard mask layer 244 may be formed using chemical vapor deposition (CVD), physical vapor deposition (PVD), atomic layer deposition (ALD), ozone oxidation, other suitable processes, or combinations thereof.

Figure 9:
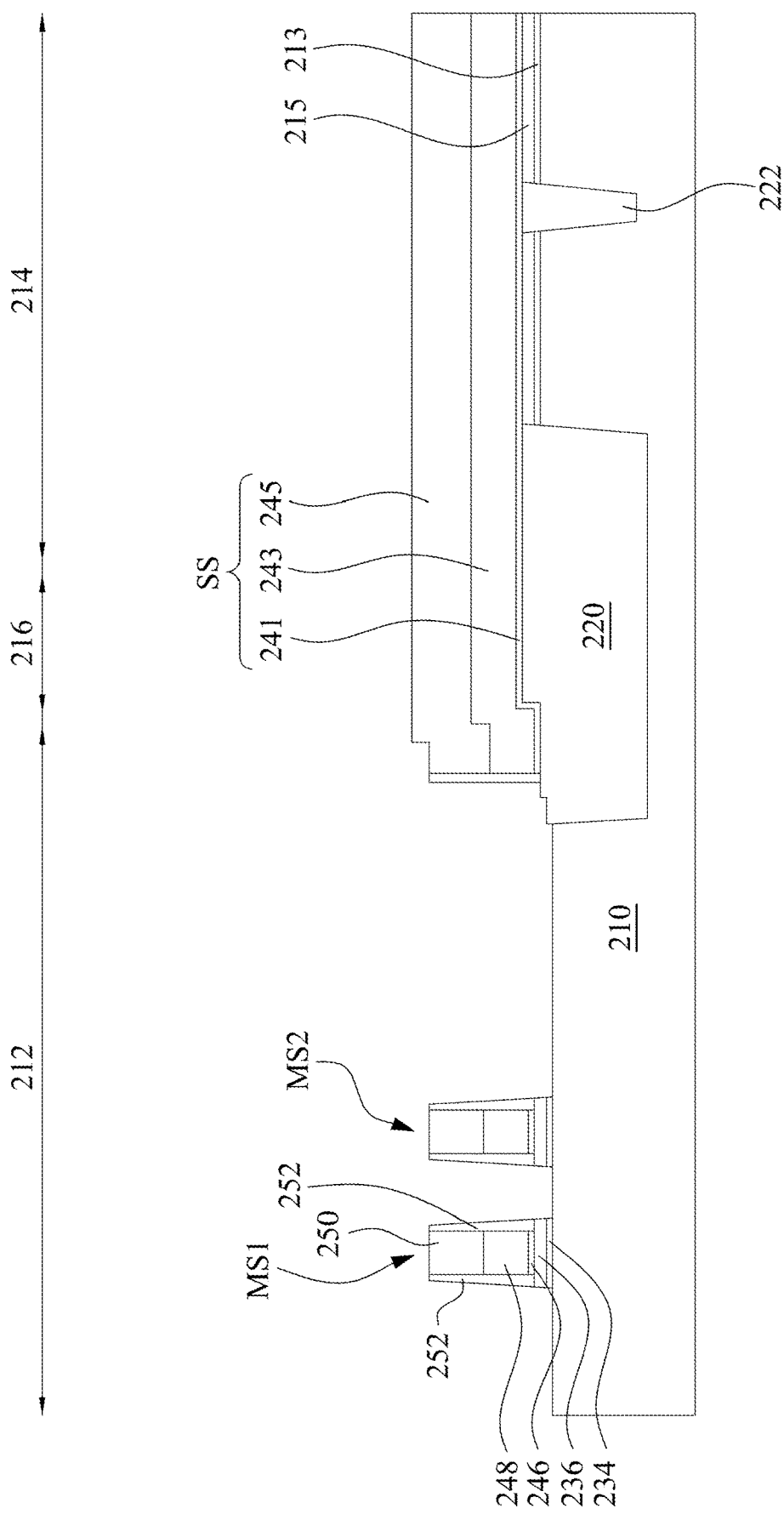

Referring to FIG. 1A, FIG. 8 and FIG. 9, the method 100 proceeds to operation 116 where the hard mask layer 244, the control gate layer 242, the blocking layer 240, the floating gate layer 232, and the tunneling layer 230 are patterned to form gate stacks MS1 and MS2 over the cell region 212 of the substrate 210 and a semiconductor stack SS over the peripheral region 214 and the transition region 216. In the embodiments of FIG. 9, the gate stacks MS1 and MS2 each includes a tunneling layer 234, a floating gate 236, a blocking layer 246, a control gate 248, and a hard mask 250. The semiconductor stack SS includes a blocking layer 241, a control gate 243 over the blocking layer 241, and a hard mask 245 over the control gate 243.

Specifically, the hard mask layer 244, the control gate layer 242, the blocking layer 240 are initially patterned to form the hard masks 250 and 245, the control gates 248 and 243, and the blocking layers 246 and 241, respectively. Subsequently, spacers 252 are disposed on sidewalls of the gate stacks MS1 and MS2 as well as a sidewall of the stack SS. In some embodiments, the spacers 252 are made of silicon oxide, silicon nitride, or the combination thereof. Formation of the spacers 252 includes, for example, forming a blanket layer of dielectric material over the substrate 210 and then performing an etching process to remove the horizontal portions of the blanket layer, while vertical portions of the blanket layer remain to form the spacers 252. Then, the floating gate layer 232 and the tunneling layer 230 are etched using the spacers 252 and hard masks 250 and 245 as etch masks and thus patterned into the floating gates 236 and the tunneling layers 234, respectively. Through the above operations, the gate stacks MS1 and MS2 as well as the semiconductor stack SS are formed. In some embodiments, at least one of the gate stacks MS1 and MS2 includes a pair of the spacers 252 over the floating gate 236, and the semiconductor stack SS includes a spacer 252 over the isolation feature 220.

Figure 10:
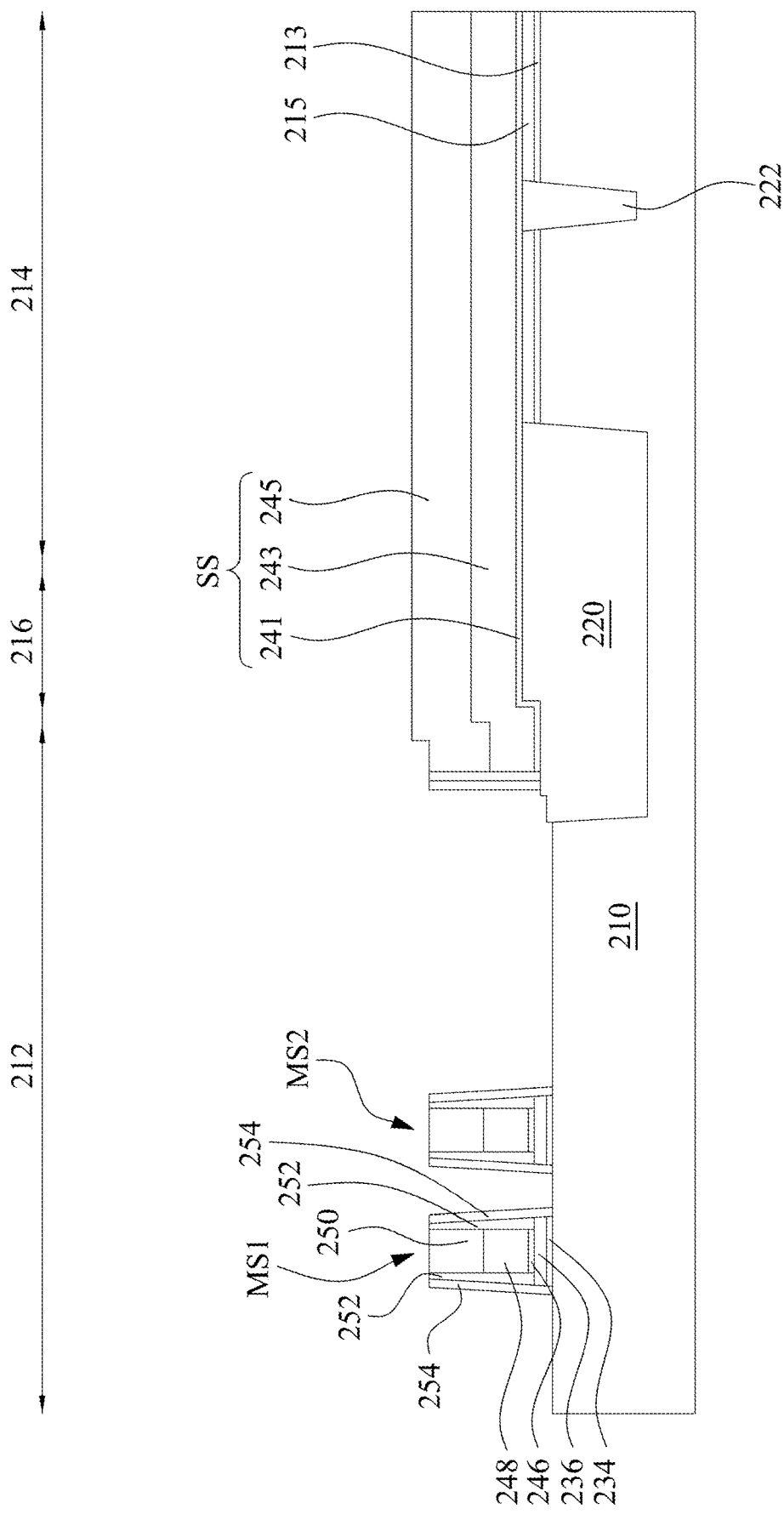

Referring to FIG. 1A and FIG. 10, the method 100 proceeds to operation 118 where inter-gate dielectric layers 254 are formed on sidewalls of the spacers 252. The inter-gate dielectric layers 254 expose a portion of the semiconductor substrate 210 between the gate stacks MS1 and MS2. In some embodiments, the inter-gate dielectric layers 254 are made of oxide, the combination of oxide, nitride and oxide (ONO), and/or other dielectric materials. In some embodiments, formation of the inter-gate dielectric layers 254 includes, for example, depositing a blanket layer of dielectric material over the substrate 210 and then performing an etching process to remove the horizontal portions of the blanket layer, while remaining vertical portions of the blanket layer to serve as the inter-gate dielectric layers 254.

Figure 11:
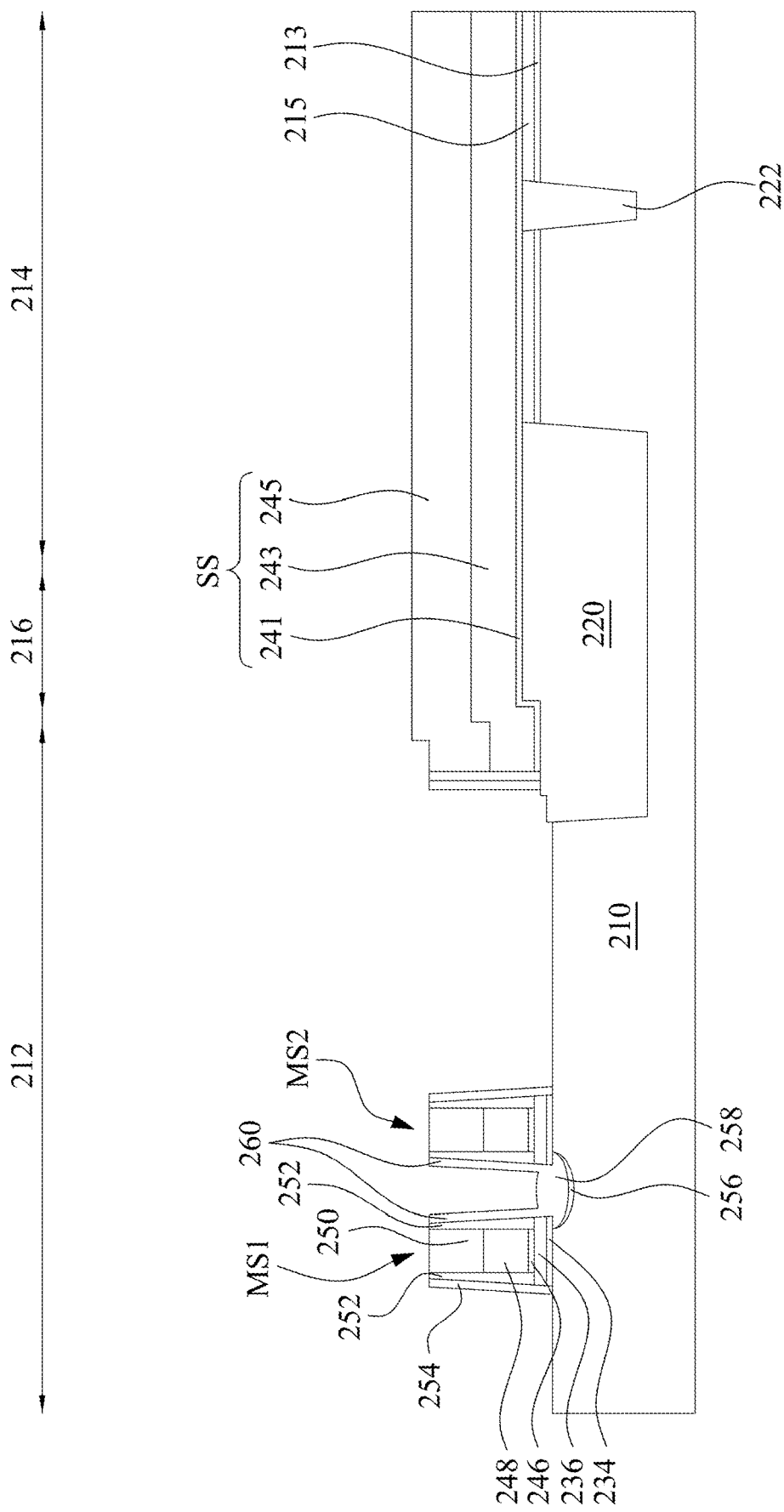

Referring to FIG. 1B and FIG. 11, the method 100 proceeds to operation 120 where a common source region 256 is formed in the exposed portion of the substrate 210 between the gate stacks MS1 and MS2. For example, ions are implanted into an exposed portion of the semiconductor substrate 210 to form the common source region 256. The gate stacks MS1 and MS2 share the common source region 256.

After the implantation, a removal process or thinning process may be performed to the inter-gate dielectric layers 254 (FIG. 10) between the gate stacks MS1 and MS2, such that the inter-gate dielectric layers 254 between the gate stacks MS1 and MS2 are thinned or removed. Then, a common source dielectric layer 258 is formed over the source region 256 using, for example, oxidation, CVD, other suitable deposition, or the like. In some embodiments, formation of the common source dielectric layer 258 (e.g., oxidation or deposition) includes depositing a dielectric layer and etching a portion of the dielectric layer that is not between the gate stacks MS1 and MS2, such that the remaining portion of the dielectric layer forms the common source dielectric layer 258 over the common source region 256 and dielectric spacers 260 alongside and between the gate stacks MS1 and MS2. The common source dielectric layer 258 and the dielectric spacers 260 may be made of silicon oxide.

Figure 12:
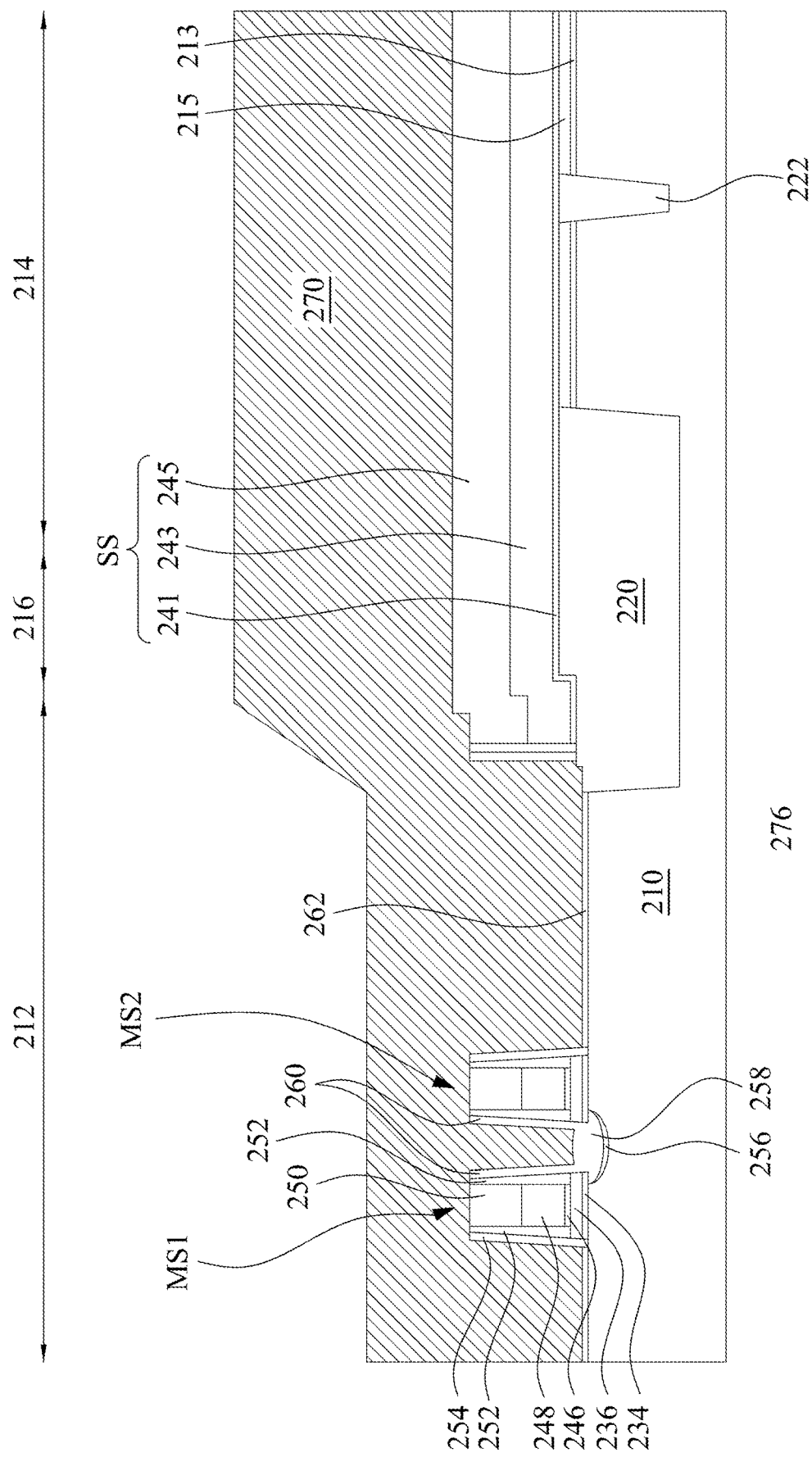

Referring to FIG. 1B and FIG. 12, the method 100 proceeds to operation 122 where select gate dielectric layers 262 are formed on the semiconductor substrate 210. The select gate dielectric layer 262 may be an oxide layer or other suitable dielectric layers. For example, the select gate dielectric layer 262 is made of silicon oxide, silicon nitride, silicon oxynitride, other non-conductive materials, or the combinations thereof. In some embodiments, a thermal oxidation process is performed, such that portions of the substrate 210 uncovered by the gate stacks MS1, MS2, and the common source dielectric layer 258 are oxidized to form the select gate dielectric layers 262. A thickness of the select gate dielectric layers 262 may be in a range of about 5 angstroms to about 500 angstroms for providing suitable electrical isolation between the substrate 210 and select gates subsequently formed. In some embodiments, the thickness of the select gate dielectric layers 262 may be smaller than that of the dielectric spacers 260 and the common source dielectric layer 258.

Still referring to the operation 122 of FIG. 1B and FIG. 12, after the select dielectric layers 262 are formed, the conductive layer 270 is formed over the select gate dielectric layers 262. In some embodiments, the conductive layer 270 is made of polysilicon, other suitable conductive materials, or combinations thereof. For example, the conductive layer 270 may include doped polysilicon or amorphous silicon. The conductive layer 270 may be formed by CVD, plasma-enhanced chemical vapor deposition (PECVD), LPCVD, or other proper processes.

Figure 13:
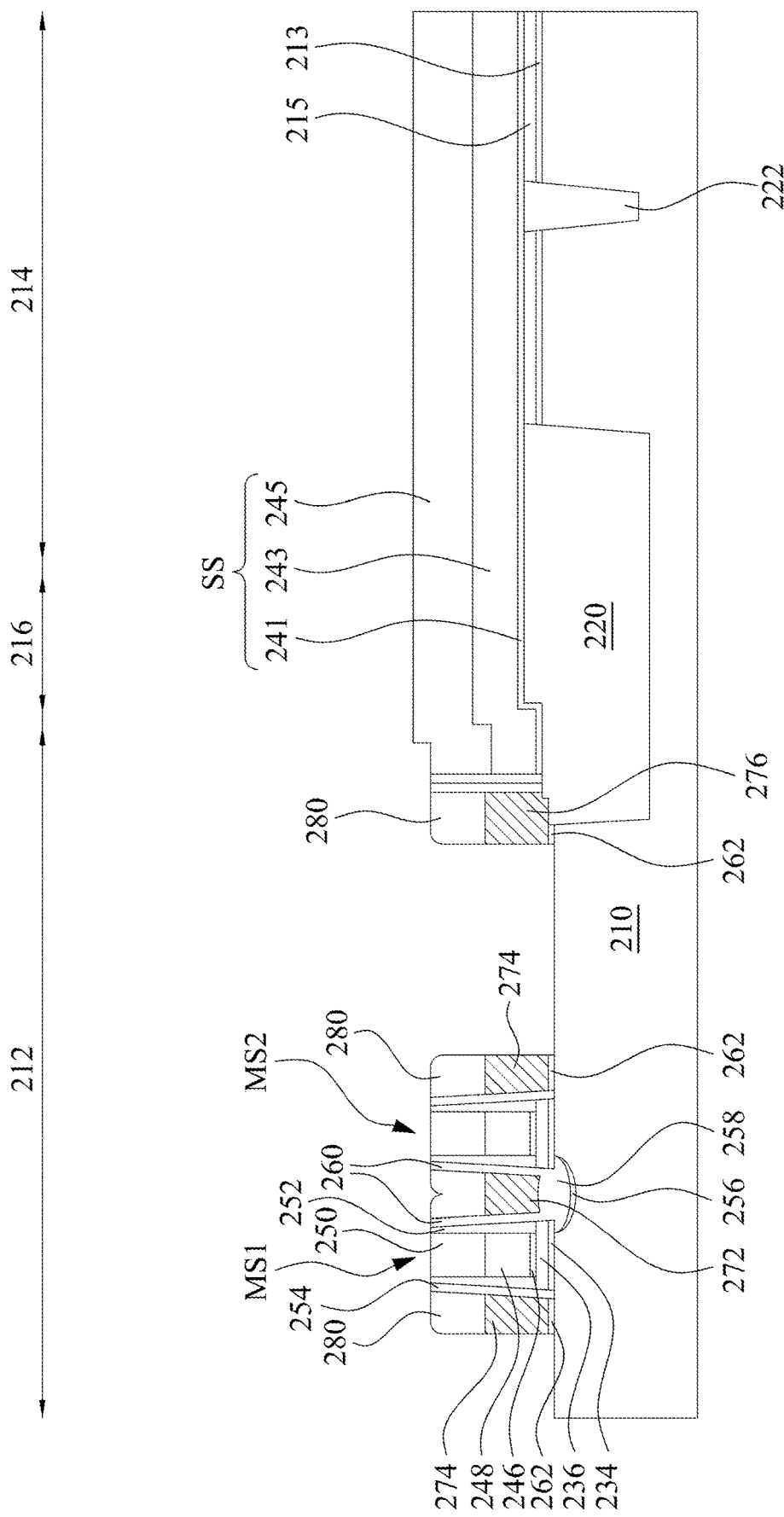

Referring to FIG. 1B and FIG. 13, the method 100 proceeds to operation 124 where the conductive layer 270 (referring to FIG. 12) is patterned to form an erase gate 272 between the gate stacks MS1 and MS2, select gates 274 on sides of the gate stacks MS1 and MS2, and a dummy gate 276 on a side of the stack SS. In some embodiments, the select gates 274 may be referred to as word lines. For example, referring to FIG. 12 and FIG. 13, the conductive layer 270 is etched back first, then, plural hard masks 280 are formed over the conductive layer 270, and an etching process is performed to pattern the conductive layer 270 using the hard masks 280 as etching masks to form the erase gate 272, the select gates 274, and the dummy gate 276. Herein, the erase gate 272 is formed over the common source dielectric layer 258, and the select gates 274 and the dummy gate 276 are formed over the select gate dielectric layers 262. Arranged between the select gates 274 and the semiconductor substrate 210, the select gate dielectric layer 262 provides electrical isolation therebetween. In some embodiments, the configuration of the dummy gate 276 can improve the cell uniformity. Herein, a top surface of the erase gate 272, top surfaces of the select gates 274, and a top surface of the dummy gate 276 are covered by the hard masks 280, and side surfaces of the select gates 274 and a side surface of the dummy gate 276 are exposed by the hard masks 280.

Figure 14:
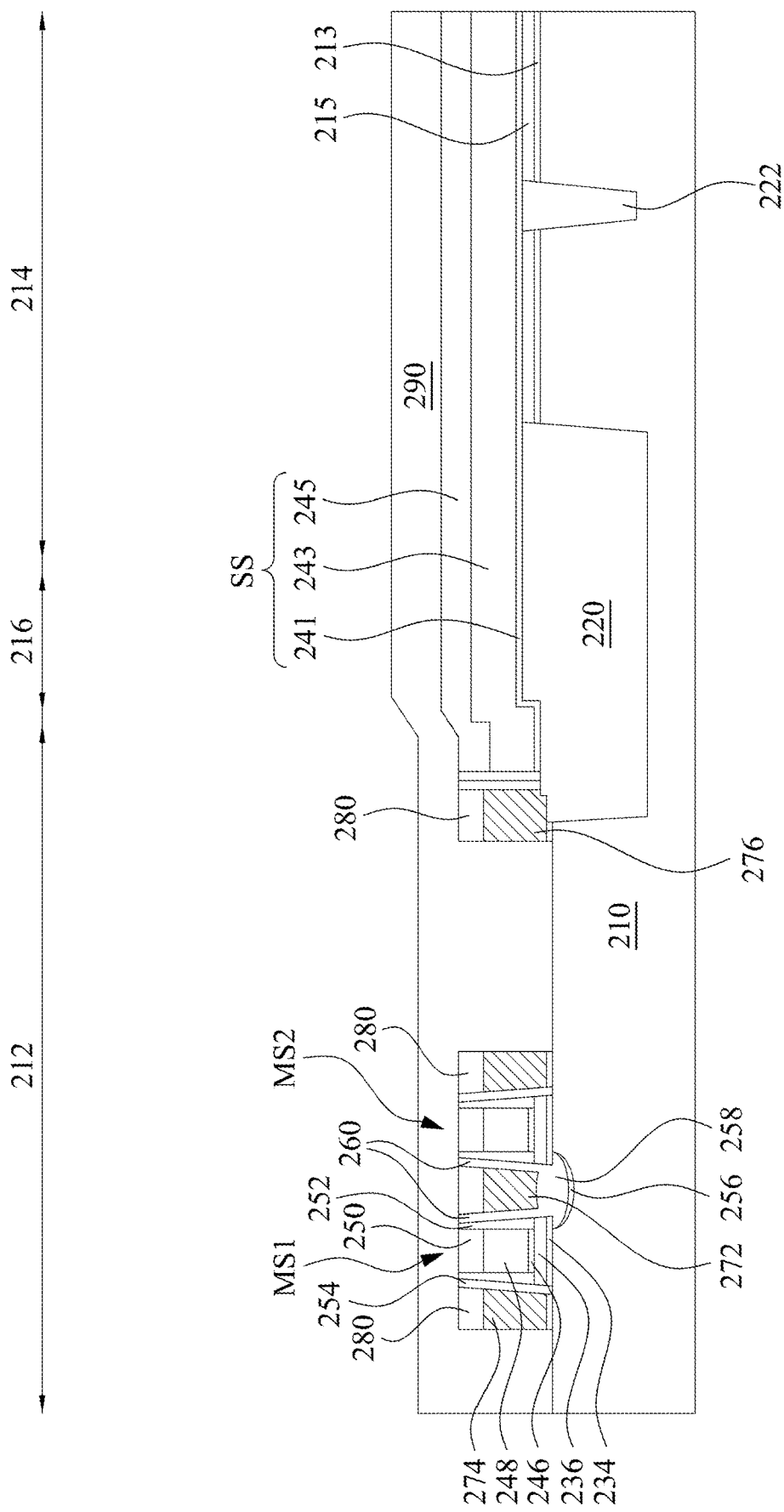

Referring to FIG. 1B and FIG. 14, the hard masks 245, 250, and 280 are etched back, and the height of the stacks in the cell region 212 is reduced. In some embodiments, prior to the etching back, a flowable material (i.e., an organic material) is formed on the structure of FIG. 13. Due to the good flowability of the flowable material, the substrate 210 uncovered by the hard masks 245, 250, and 280 are covered by thicker flowable material, thereby the substrate 210 uncovered by the hard masks 245, 250, and 280 are prevented from being damaged during the etch back process. The etch back process may also remove the flowable material. In some embodiments, the etch back process is performed, such that the hard mask 245 has a tilted portion.

Still referring to FIG. 1B and FIG. 14, after the etch back process, the method 100 proceeds to operation 126 where a protective layer 290 is formed over the semiconductor substrate 210 to cover the gate stacks MS1 and MS2 and the stack SS. In some embodiments, the protective layer 290 is, for example, made of amorphous silicon, polysilicon, silicon oxide, silicon nitride, silicon oxynitride, other suitable materials, or the combinations thereof. The protective layer 290 may be formed by suitable deposition methods, such as CVD or the like. In some embodiments, prior to deposition of the protective layer 290, a cleaning process may be performed to remove particles on the substrate 210.

Figure 15:
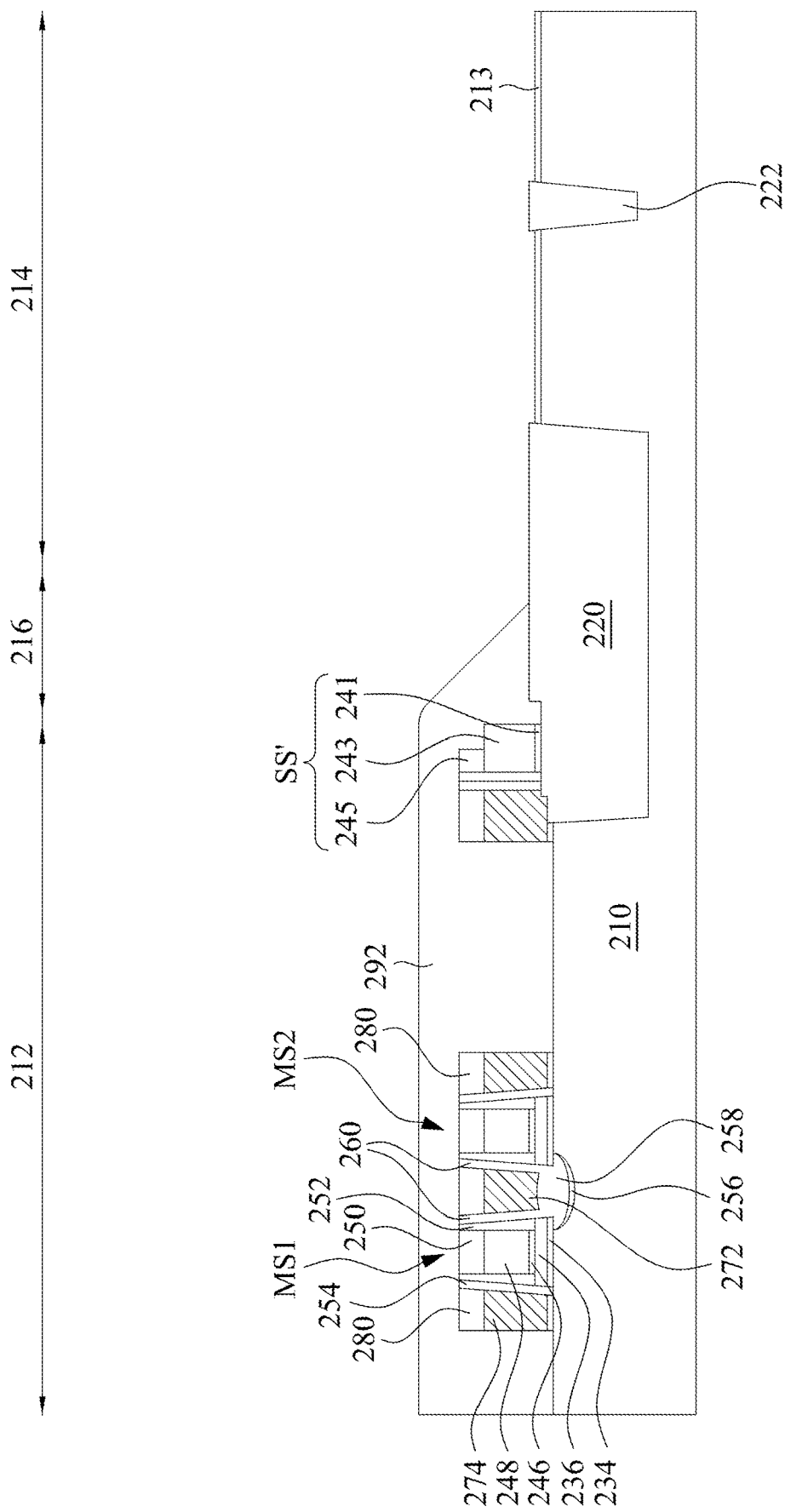

Referring to FIG. 1B, FIG. 14 and FIG. 15, the method 100 proceeds to operation 128 where an etching process is performed to remove a portion of the stack SS over the peripheral region 214 and the transition region 216, and a remaining portion of the semiconductor stack SS is referred to as the stack SS' hereinafter. For example, a photoresist mask is formed on the protective layer 290 over the cell region 212, and a portion of the protective layer 290 over the transition region 216 and the peripheral region 214 is exposed from the photoresist mask. Then, an etching process is performed to remove the exposed portion of the protective layer 290 and the underlying portions of the hard mask 245, the control gate 243, and the blocking layer 241. After the etching process, the stack SS' remains over the cell region 212 and a portion of the protective layer 290 remains over the stack SS'. After the etching process, a protective material (e.g., amorphous silicon, polysilicon, silicon oxide, silicon nitride, silicon oxynitride, other suitable materials, or the combinations thereof) is blanket formed over the substrate 210, and an etching back process is performed to the protective material to form the protective layer 292 including the remaining portion of the protective layer 290. The protective layer 292 may have a tapered profile and cover the stack SS' and the gate stacks MS1 and MS2 for protecting the stack SS', and the protective layer 292 exposes the peripheral region 214 and a portion of the transition region 216.

Still referring to FIG. 1B and FIG. 15, after the formation of the protective layer 292, the mask layer 215 (referring to FIG. 14) over the peripheral region 214 is removed through a suitable etching process, while the stack SS' and the gate stacks MS1 and MS2 remain intact because of the protection of the protective layer 292. For example, an etch process is performed, and the protective layer 292 has a higher etch resistance than that of the mask layer 215, such that the mask layer 215 is removed while the protective layer 292 remains intact.

Figure 16:
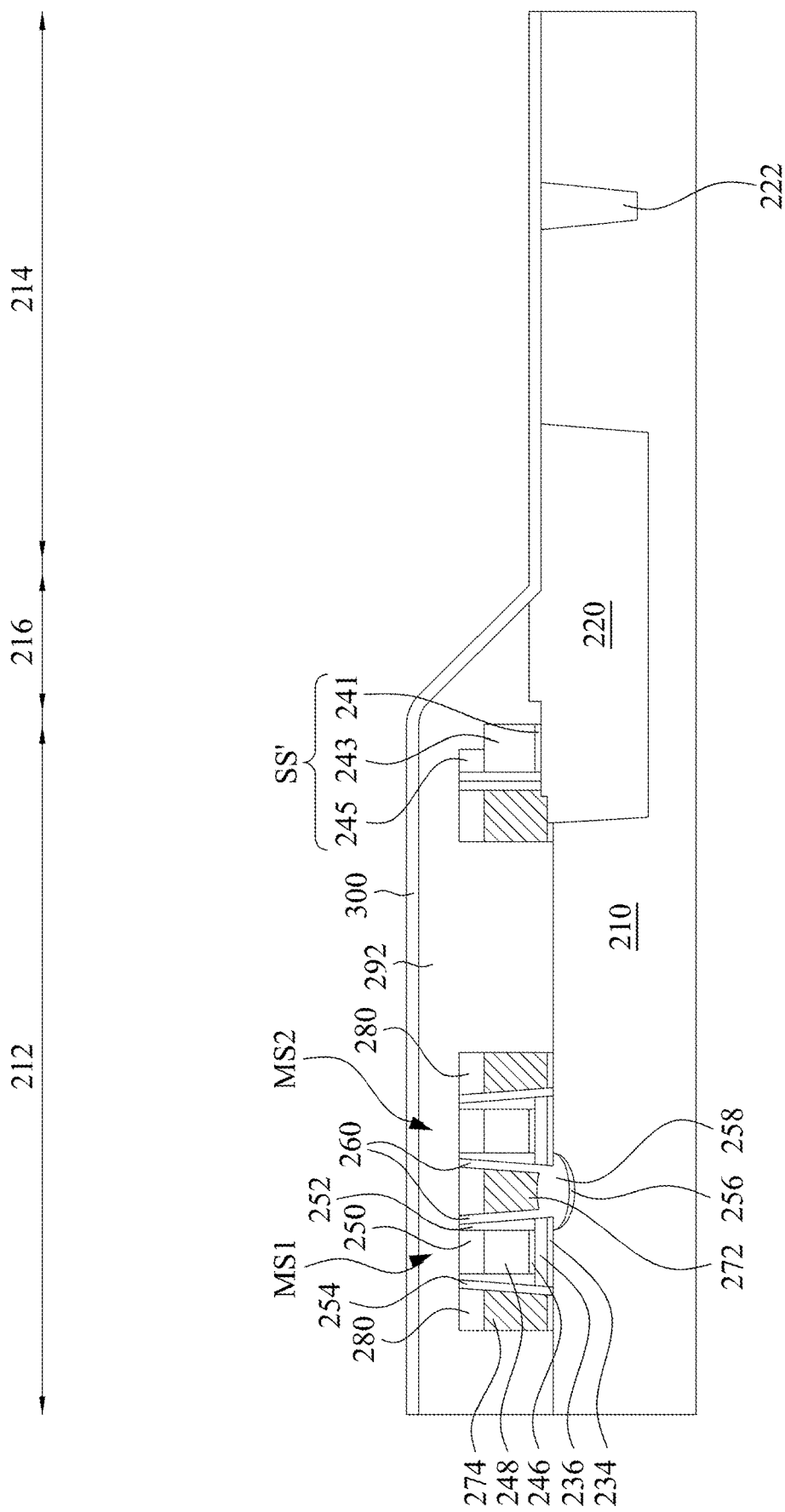

Referring to FIG. 1B, FIG. 15 and FIG. 16, the method 100 proceeds to operation 130 where a first dielectric layer 300 is blanket formed over the protective layer 292, the isolation features 220 and 222, as well as the substrate 210. In some embodiments, one or more processes (e.g., one or more lithography, etching and implantation processes) are initially performed to remove protruding portions of the isolation features 220 and 222 as well as the pad layer 213, such that a planar surface is yielded in the peripheral region 214 and a portion of the transition region 216. Then, the implantation process can be performed to some portions of the semiconductor substrate 210 in the peripheral region 214, so that several wells (not shown) having different concentrations of impurities are formed. In some embodiments, the core device and the high voltage device will be subsequently formed in the peripheral region 214, and in the portion where the core device is subsequently formed, the concentration of the impurities may be greater than the concentration of the impurities of the portion where the high voltage device is subsequently formed because a channel length of the core device is shorter than a channel length of the high voltage device. In some embodiments, the implantation is performed to form a N well, a P well or a combination thereof in the peripheral region 214.

Subsequently, the first dielectric layer 300 is deposited. In some embodiments, the first dielectric layer 300 may be formed of silicon oxide or metal oxide by using, for example, thermal oxidation, chemical vapor deposition (CVD), atomic layer deposition (ALD) and the like. In some embodiments, a thickness of the first dielectric layer 300 may be in a range from about 5 Å to about 500 Å. When the first dielectric layer 300 is thinner than 5 Å, the thickness of the edge portions of the subsequently formed gate dielectric layer is insufficient, leading to a higher risk of the GIDL. On the other hand, the thickness of the first dielectric layer 300 greater than 500 Å is disadvantageous to the etching process for patterning the first dielectric layer 300, causing an undesired profile of the gate dielectric layer.

Figure 17:
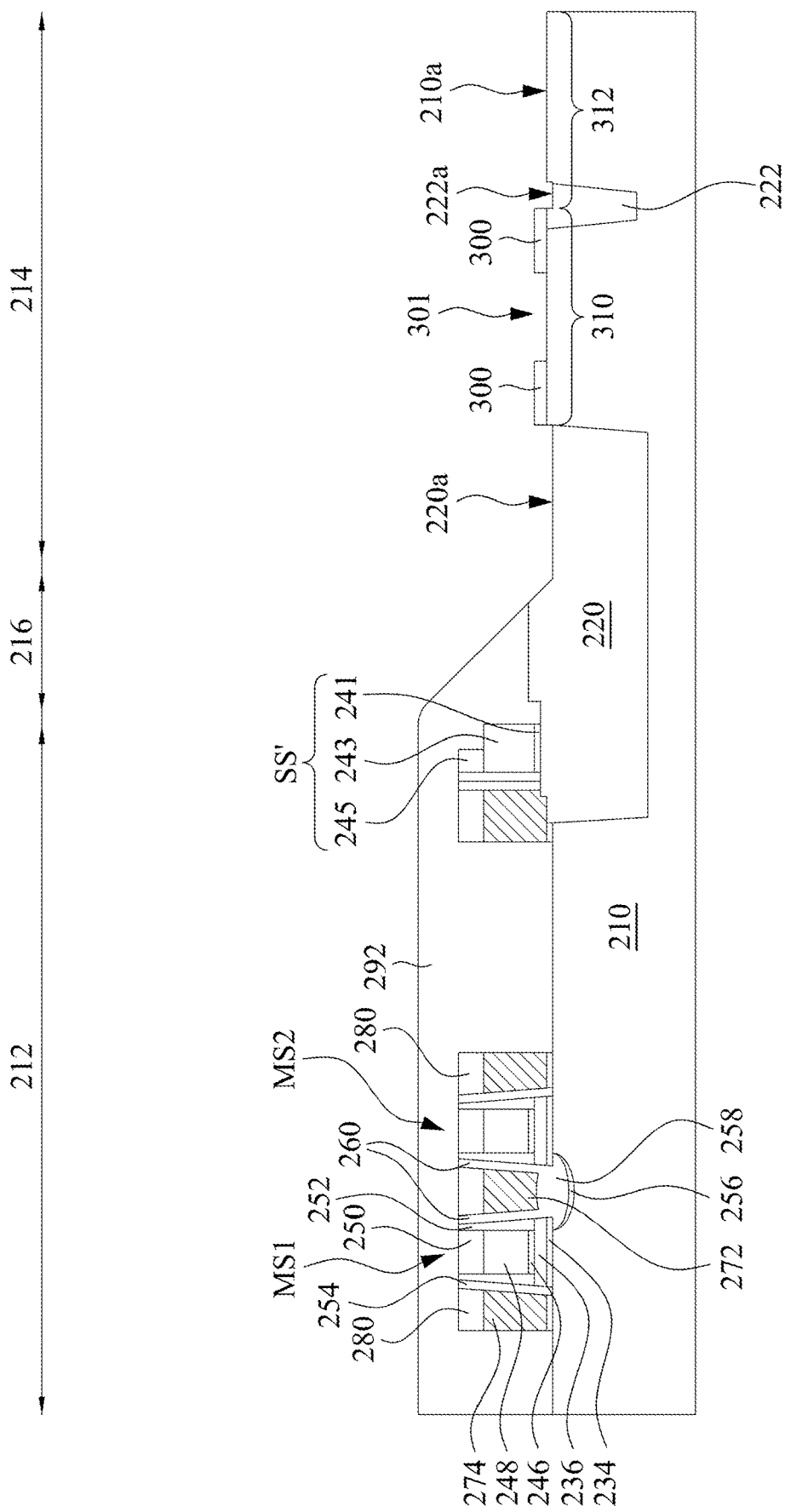

Referring to FIG. 1B and FIG. 17, the method 100 proceeds to operation 132 where the first dielectric layer 300 is patterned. In some embodiments, a photoresist layer (not shown) may be formed on the first dielectric layer 300, and then the photoresist layer is patterned such that portions of the first dielectric layer 300 between the isolation features 220 and 222 are covered by the patterned photoresist layer, while the other portions of the first dielectric layer 300 are exposed from the patterned photoresist layer. Subsequently, the first dielectric layer 300 is etched using the patterned photoresist layer as a mask, such that the portions of the first dielectric layer 300 underlying the patterned photoresist remain on the semiconductor substrate 210. For example, two portions of the first dielectric layer 300 respectively adjacent to the isolation features 220 and 222 remain. In some embodiments, etching the first dielectric layer 300 may be performed by using a wet etching operation or a dry etching operation. An area where the first dielectric layer 300 remains (including the portion of the semiconductor substrate 210 between the two portions of the first dielectric layer 300) may be referred as to a high voltage area 310 which the high voltage device is formed therein; and, an area that adjacent to the high voltage area 310 in the peripheral region 214 may be referred as to a core area 312 which the core device can be formed therein. In some embodiments, the core area 312 substantially surrounds the high voltage area 310. By the etching process, an opening 301 is formed between the two portions of the first dielectric layer 300.

In some embodiments, etching the first dielectric layer 300 further includes etching portions of the isolation features 220 and 222 that are not covered by the patterned photoresist layer, and thus portions of the isolation features 220 and 222 are recessed. In other words, top surfaces 220a and 222a of the recessed portions of the isolation features 220 and 222 are lower than top surfaces of their adjacent portions of the isolation features 220 and 222. In some embodiments, each of these portions has a top surface (e.g., the top surfaces 220a and 222a) that is lower that a top surface 210a of the semiconductor substrate 210.

Figure 18:
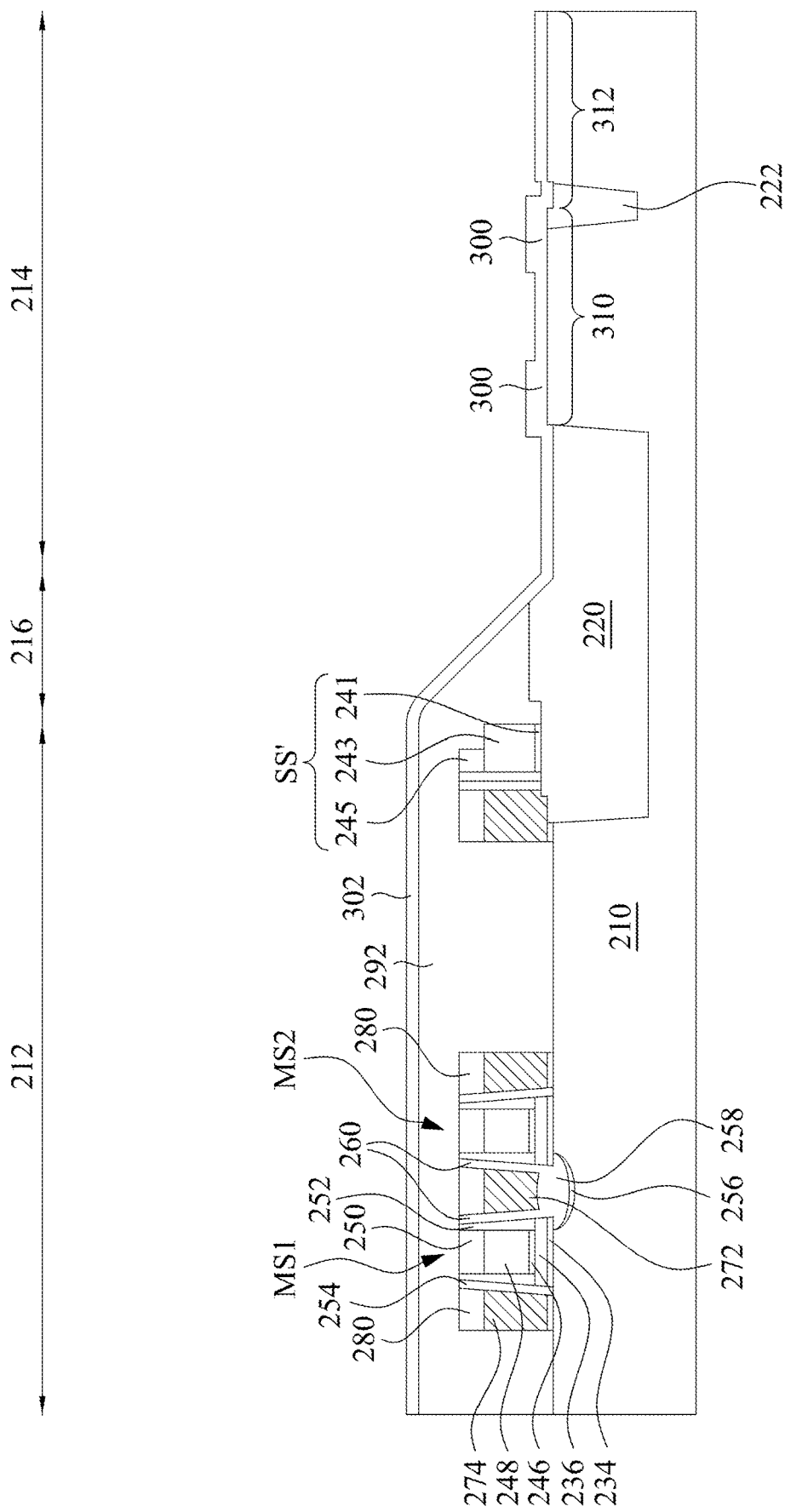

Referring to FIG. 1B, FIG. 17 and FIG. 18, the method 100 proceeds to operation 134 where a second dielectric layer 302 is conformally formed over the protective layer 292, the isolation features 220 and 222, the patterned first dielectric layer 300 and the semiconductor substrate 210. The second dielectric layer 302 formed on the first dielectric layer 300 has a top surface that is higher than a top surface of the second dielectric layer 302 filled in the opening 301, such that a combination of the first and second dielectric layers 300 and 302 has a concave profile. The material and the method for forming the second dielectric layer 302 are same as or similar to the material and the method for forming the first dielectric layer 300, and may not be repeated herein. In the embodiments of FIG. 18, the first dielectric layer 300 and the second dielectric layer 302 may be formed by the same material, and thus an interface between the first dielectric layer 300 and the second dielectric layer 302 may not be observable. In other embodiments where the first dielectric layer 300 and the second dielectric layer 302 are formed from different materials, the interface between the first dielectric layer 300 and the second dielectric layer 302 may be observable.

Figure 1C:
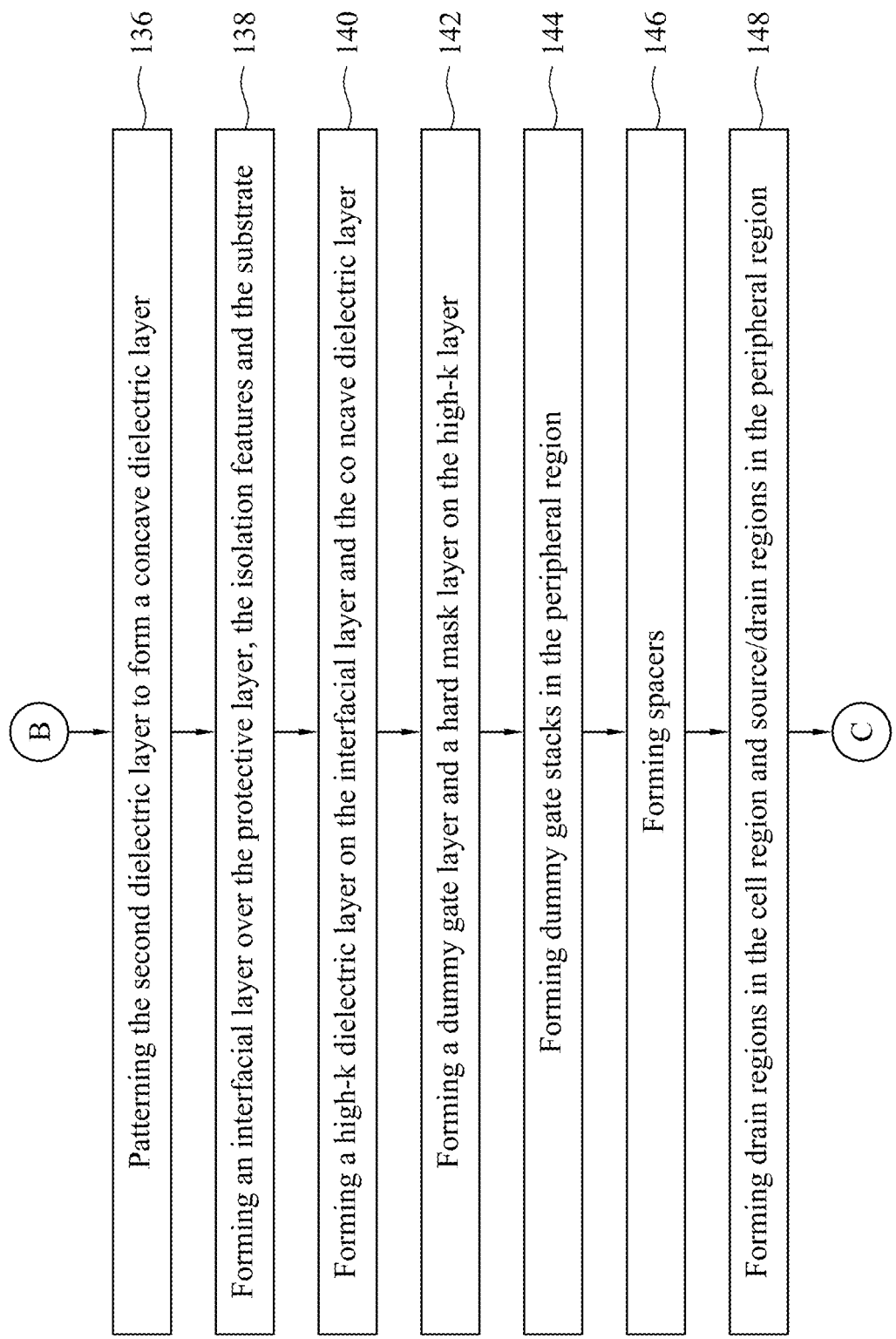
Figure 19:
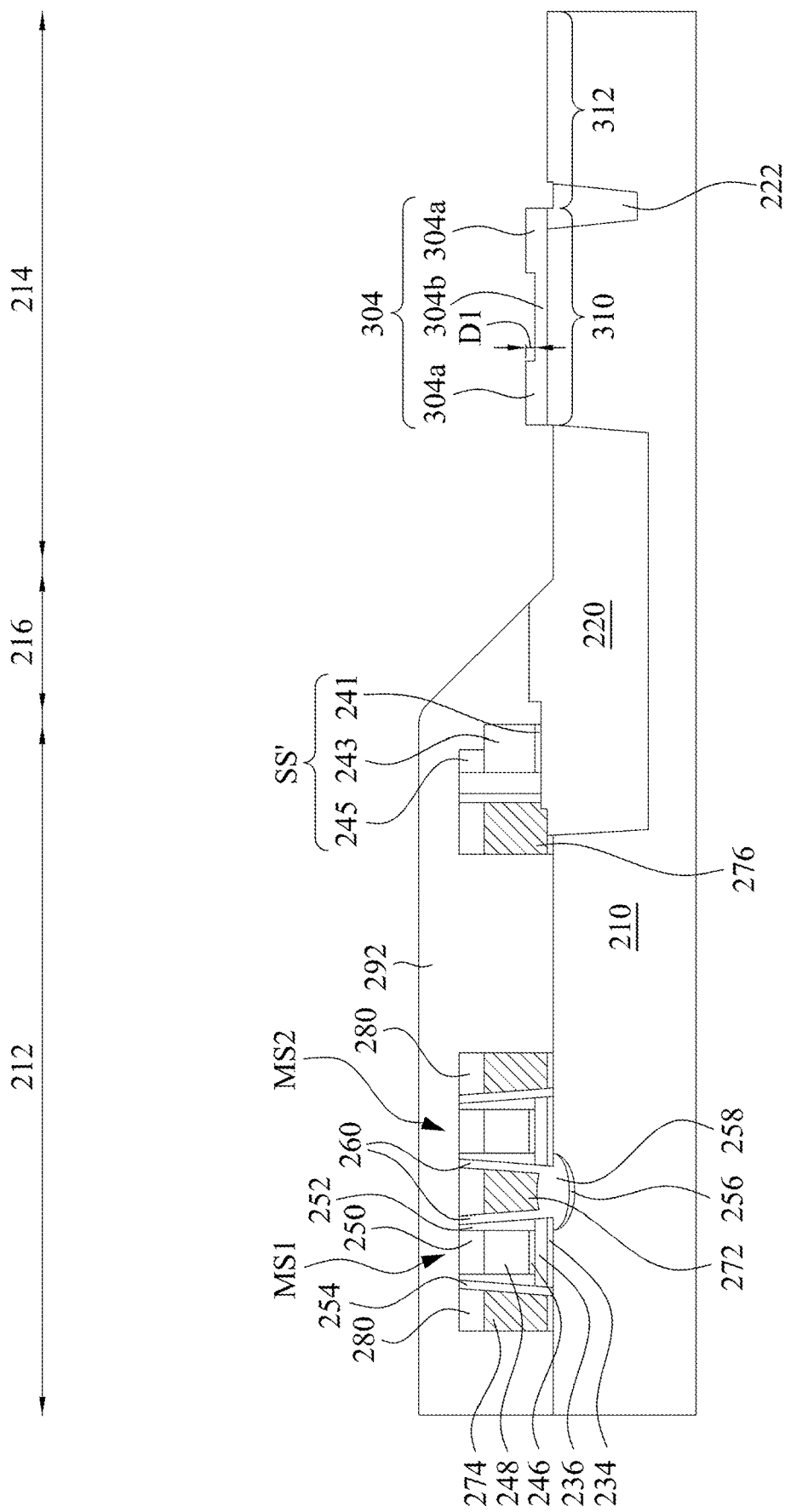

Referring to FIG. 1C, FIG. 18 and FIG. 19, the method 100 proceeds to operation 136 where the second dielectric layer 302 is patterned. In some embodiments, a photoresist layer (not shown) may be formed on the second dielectric layer 302, and then the photoresist layer is patterned such that a portion of the second dielectric layer 302 in the high voltage area 310 is covered by the patterned photoresist layer, while the other portions of the second dielectric layer 302 are exposed from the photoresist layer. Subsequently, the second dielectric layer 302 is etched using the patterned photoresist layer as a mask, such that the portion of the second dielectric layer 302 in the high voltage area 310 remain on the first dielectric layer 300 on the semiconductor substrate 210. In some embodiments, etching the second dielectric layer 302 may be performed by using a wet etching operation or a dry etching operation.

After the second dielectric layer 302 is patterned, the remaining portions of the first dielectric layer 300 and the second dielectric layer 302 may be referred to as a concave dielectric layer 304. Edge portions 304a of the concave dielectric layer 304 are thicker than a middle portion 304b of the concave dielectric layer 304. In some embodiments, a thickness of each edge portion 304a is greater than a thickness of the middle portion 304b by about 10% or more than 10%. In some other embodiments, the thickness of each edge portion 304a is greater than the thickness of the middle portion 304b by about 10% to about 100%. An increased thickness of the edge portions 304a is advantageous to reduction of GIDL. However, when the edge portions 304a are too thick, a driving current of the high voltage device would decrease, leading to unsatisfactory performance of the high voltage device. The difference between the thicknesses of the edge portions 304a and the middle portion 304b results in the concave profile having a concave depth D1. In some embodiments, to adjust the concave depth D1 of the concave dielectric layer 304, the operations 130 and 132 may be repeated for several times to thicken the edge portions 304a, followed by the operations 134 and 136. Alternatively, the thicknesses of the first dielectric layer 300 and the second dielectric layer 302 may be respectively adjusted to obtain different concave depth D1 according to the design of the semiconductor device.

Figure 20:
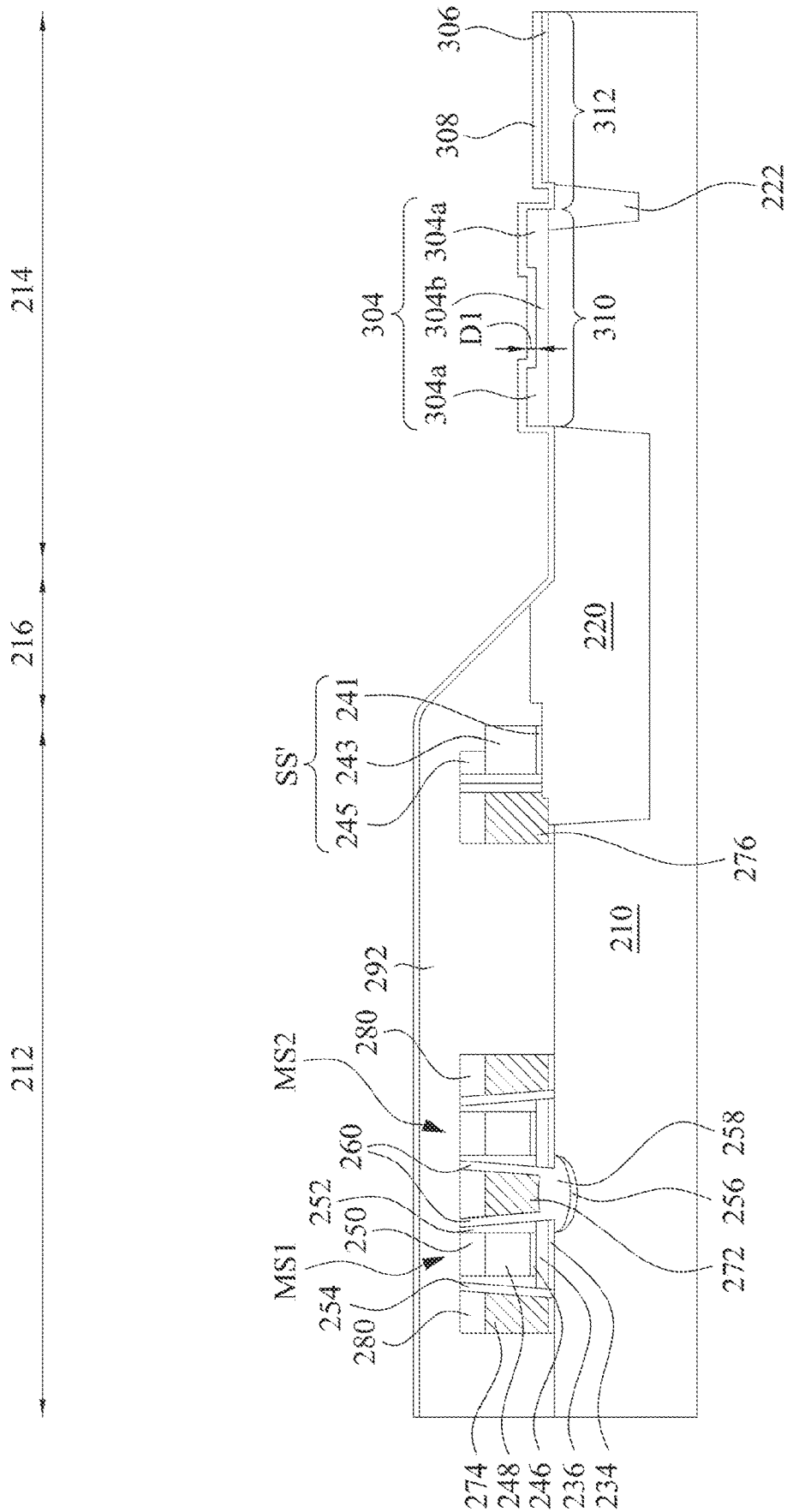

Referring to FIG. 1C and FIG. 20, the method 100 proceeds to operation 138 where an interfacial layer 306 is formed on the semiconductor substrate 210. In some embodiments, the interfacial layer 306 may be formed by rapid thermal oxidation and annealing. Alternatively, the interfacial layer 306 may be formed by applying SC1 (1$^{st}$ step standard clean of RCA clean) solution over the protective layer 292, the isolation features 220 and 222, the concave dielectric layer 304 and the semiconductor substrate 210. In some embodiments, the interfacial layer 306 may not be formed on the concave dielectric layer 304 because the material of the concave dielectric layer 304 may be same as the interfacial layer 306 (e.g., silicon dioxide). In some embodiments, a thickness of the interfacial layer 306 is in a range from about 0.7 nm to about 1 nm. The interfacial layer 306 provides sufficient adhesion between the semiconductor substrate 210 and the subsequently formed high-k dielectric layer.

Still referring to FIG. 1C and FIG. 20, as shown in operation 140, a high-k dielectric layer 308 is then formed on the interfacial layer 306 and the concave dielectric layer 304 after the interfacial layer 306 is formed. The high-k dielectric layer 308 is conformally deposited on the interfacial layer 306 and the concave dielectric layer 304. Examples of the high-k material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, a thickness of the high-k dielectric layer 308 is greater than a thickness of the interfacial layer 306. In a further embodiment, the thickness of the high-k dielectric layer 308 is greater than about 0.5 nm and smaller than about 10 nm. When the thickness of the high-k dielectric layer 308 is greater than 10 nm, the $I_{dsat}$ of the core device is too weak.

Figure 21:
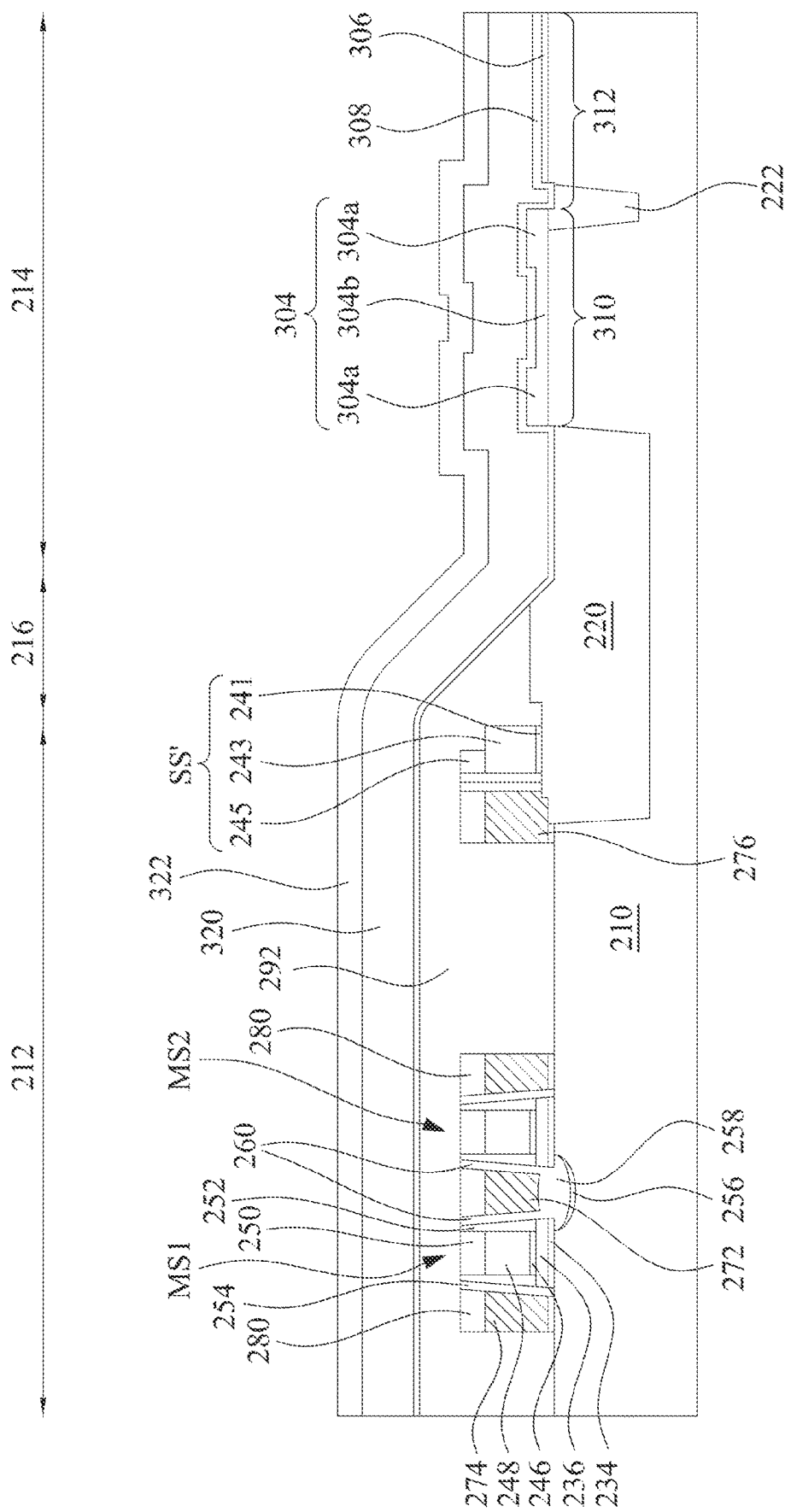

Referring to FIG. 1C and FIG. 21, the method 100 proceeds to operation 142 where a dummy gate layer 320 is formed on the high-k dielectric layer 308. In some embodiments, the dummy gate layer 320 may be made of conductive materials, such as a polysilicon layer. The dummy gate layer 320 may be deposited by CVD, and low-pressure CVD (LPCVD) is applied in some embodiments. In the embodiment of FIG. 21, topography of a portion of the dummy gate layer 320 formed above the concave dielectric layer 304 corresponds to topography of the concave dielectric layer 304. That is, a top surface of the dummy gate layer 320 located directly over the edge portions 304a of the concave dielectric layer 304 is higher than a top surface of the dummy gate layer 320 located directly over the middle portion 304b of the concave dielectric layer 304. However, compared to the top surface of the concave dielectric layer 304, the top surface of the dummy gate layer 320 may be relatively flat because of the great thickness of the dummy gate layer 320 in other embodiments.

After the dummy gate layer 320 is formed, a hard mask layer 322 is then formed on the dummy gate layer 320. The hard mask layer 322 may include single layer or multiple layers. In some embodiments, the hard mask layer 322 includes SiN/$SiO_2$/SiN stacked layers or other suitable materials. In some embodiments, the hard mask layer 322 may be formed using chemical vapor deposition (CVD), physical vapor deposition (PVD), atomic layer deposition (ALD), ozone oxidation, other suitable processes, or combinations thereof. Similarly to the dummy gate layer 320, in the embodiment of FIG. 21, topography of a portion of the hard mask layer 322 formed above the concave dielectric layer 304 corresponds to the topography of the concave dielectric layer 304. That is, a top surface of the hard mask layer 322 located directly over the edge portions 304a of the concave dielectric layer 304 is higher than a top surface of the hard mask layer 322 located directly over the middle portion 304b of the concave dielectric layer 304. However, compared to the top surface of the concave dielectric layer 304, the top surface of the hard mask layer 322 may be relatively flat according to the topography of the dummy gate layer 320 or the thickness of the hard mask layer 322 in other embodiments.

Figure 22:
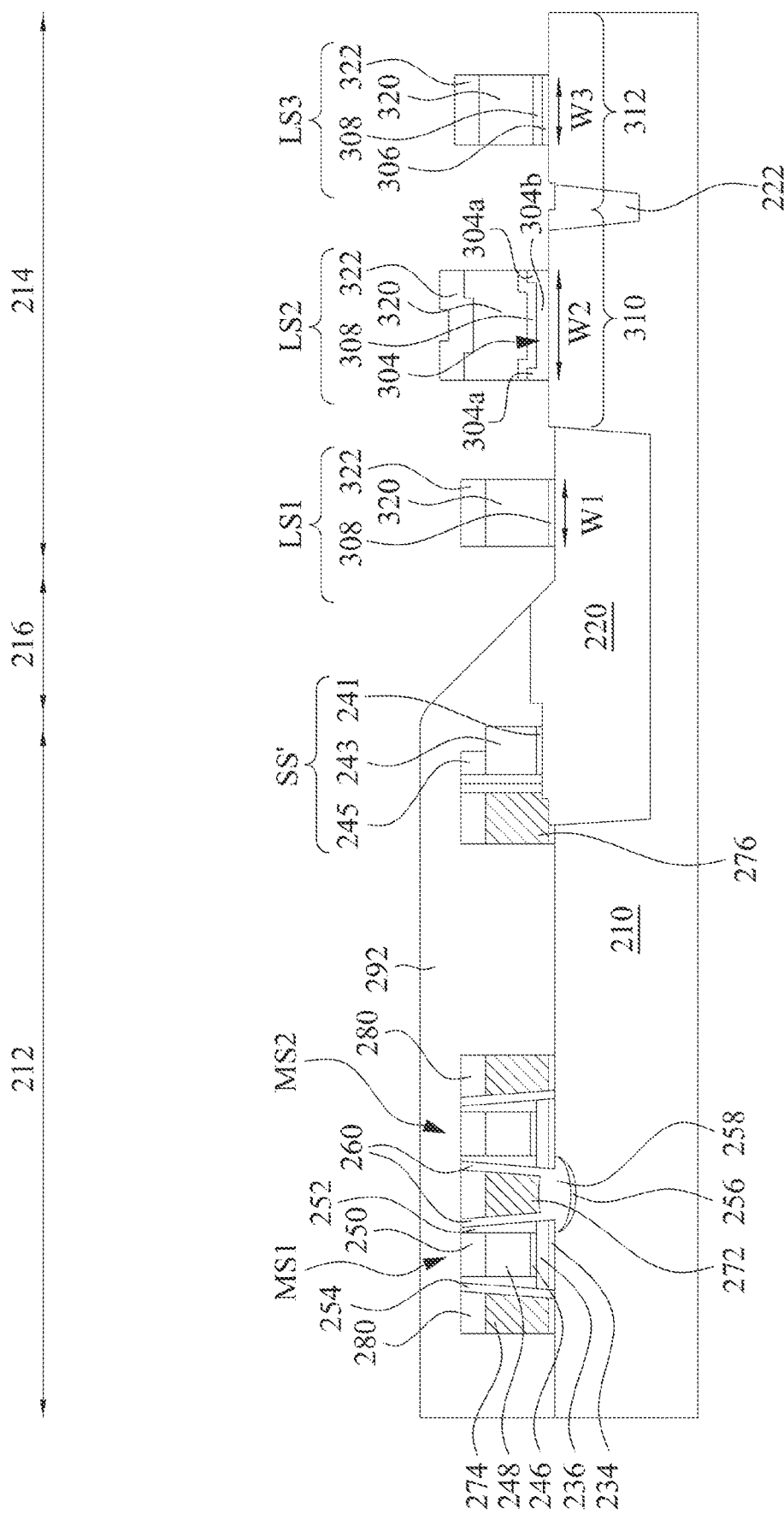

Referring to FIG. 1C and FIG. 22, the method 100 proceeds to operation 144 where the hard mask layer 322, the dummy gate layer 320, the high-k dielectric layer 308 and the interfacial layer 306 are patterned to form dummy gate stacks LS1, LS2 and LS3 in the peripheral region 214. As shown in FIG. 22, the gate stack LS1 includes the high-k dielectric layer 308, the dummy gate layer 320 and the hard mask layer 322, and the gate stack LS3 includes the interfacial layer 306, the high-k dielectric layer 308, the dummy gate layer 320 and the hard mask layer 322, in which the dummy gate stack LS1 is located on the isolation feature 220 and the dummy gate stack LS3 is located on the core area 312. Each of these layers has a relatively flat top surface, compared to a top surface of the dummy gate stack LS2. The dummy gate stack LS2 includes the concave dielectric layer 304, the high-k dielectric layer 308, the dummy gate layer 320 and the hard mask layer 322, and the dummy gate stack LS2 is located on the high-voltage area 310. In some embodiments, a width W2 of the dummy gate stack LS2 may be greater than a width W1 of the dummy gate stack LS1 and a width W3 of the dummy gate stack LS3.

The GIDL occurs when the dielectric layer for separating the gate electrode and source/drain regions has an insufficient thickness. Therefore, a width of the edge portions 304a is defined such that the source/drain regions (formed subsequently) do no overlay the middle portion 304b, so as to tackle the problem of the GIDL. On the other hand, the edge portions 304a having a great width may cause weak $I_{dsat}$. In some embodiments, a sum of widths of the edge portions 304a may be about 5% to about 30% of the width W2. In certain embodiments, the about 5% to about 30% of the width W2 is in a range from about 1 nm to about 200 nm. When the sum of the widths of the edge portions 304a is smaller than 5% of the width W2 or smaller than about 1 nm, the GIDL may occur. On the other hand, when the sum of the widths of the edge portions 304a is greater than 30% of the width W2 or greater than about 200 nm, the $I_{dsat}$ of the device formed in the high-voltage area 310 may be too weak, leading to insufficient performance of the high voltage device. In the embodiment of FIG. 22, a top surface of the dummy gate stack LS2 is recessed, which is similar to the descriptions of FIG. 21. Similarly, in other embodiments, the top surface of the dummy gate stack LS2 may be substantially flat, depending on the thicknesses of the dummy gate layer 320 and the hard mask layer 322, or the concave depth of the concave dielectric layer 304.

Figure 23:
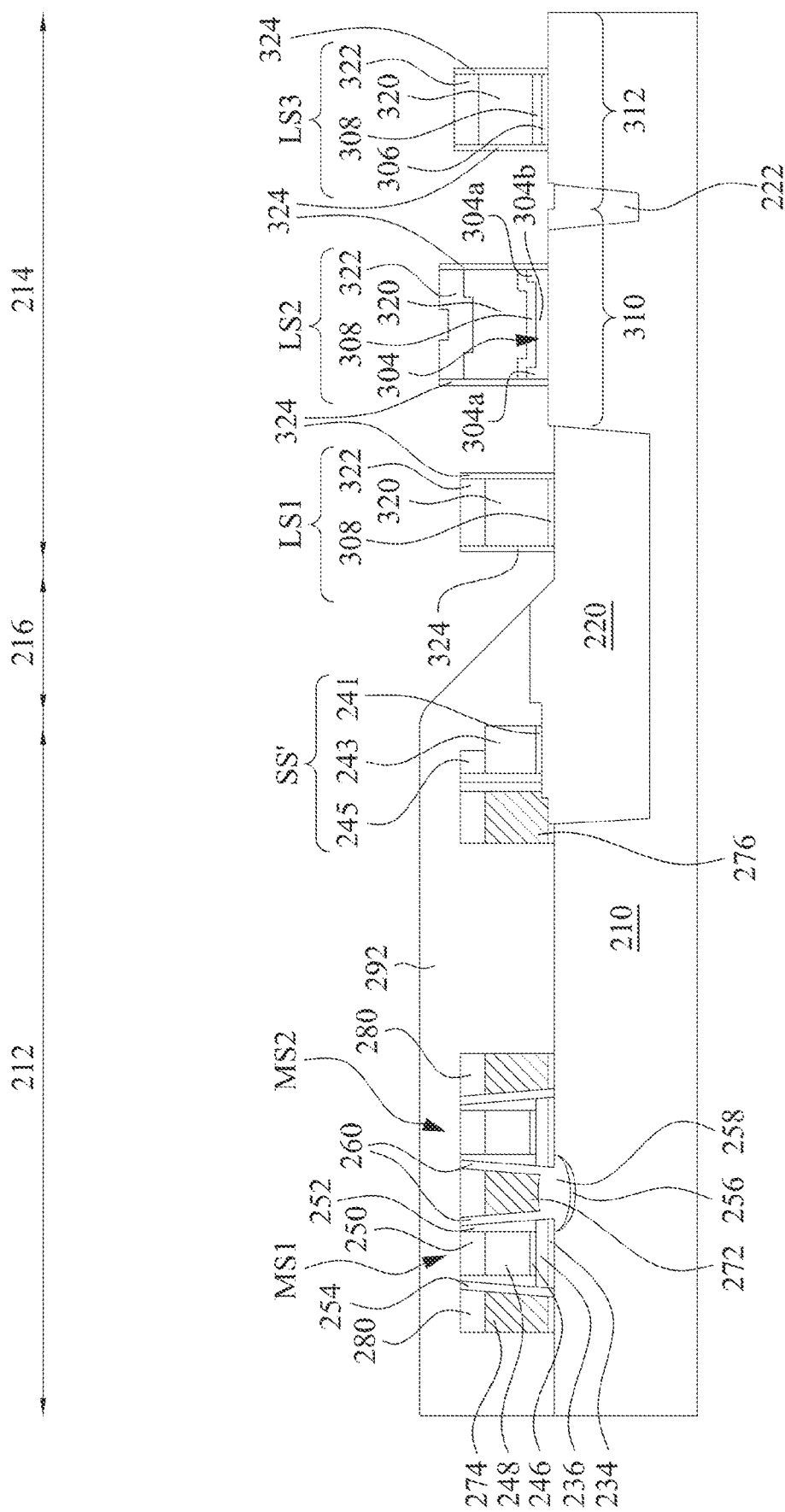

Reference is made to FIG. 23, seal layers 324 are formed on opposite sidewalls of the dummy gate stacks LS1, LS2 and LS3. For example, a dielectric seal layer may be conformally formed over the structure of FIG. 22, and an etching process (e.g. anisotropic etching process) is performed to remove horizontal portions of the dielectric seal layer, and vertical portions of the dielectric spacer layer remain to form the seal layers 324. The seal layers 324 may be made of silicon nitride or other suitable materials.

Figure 24:
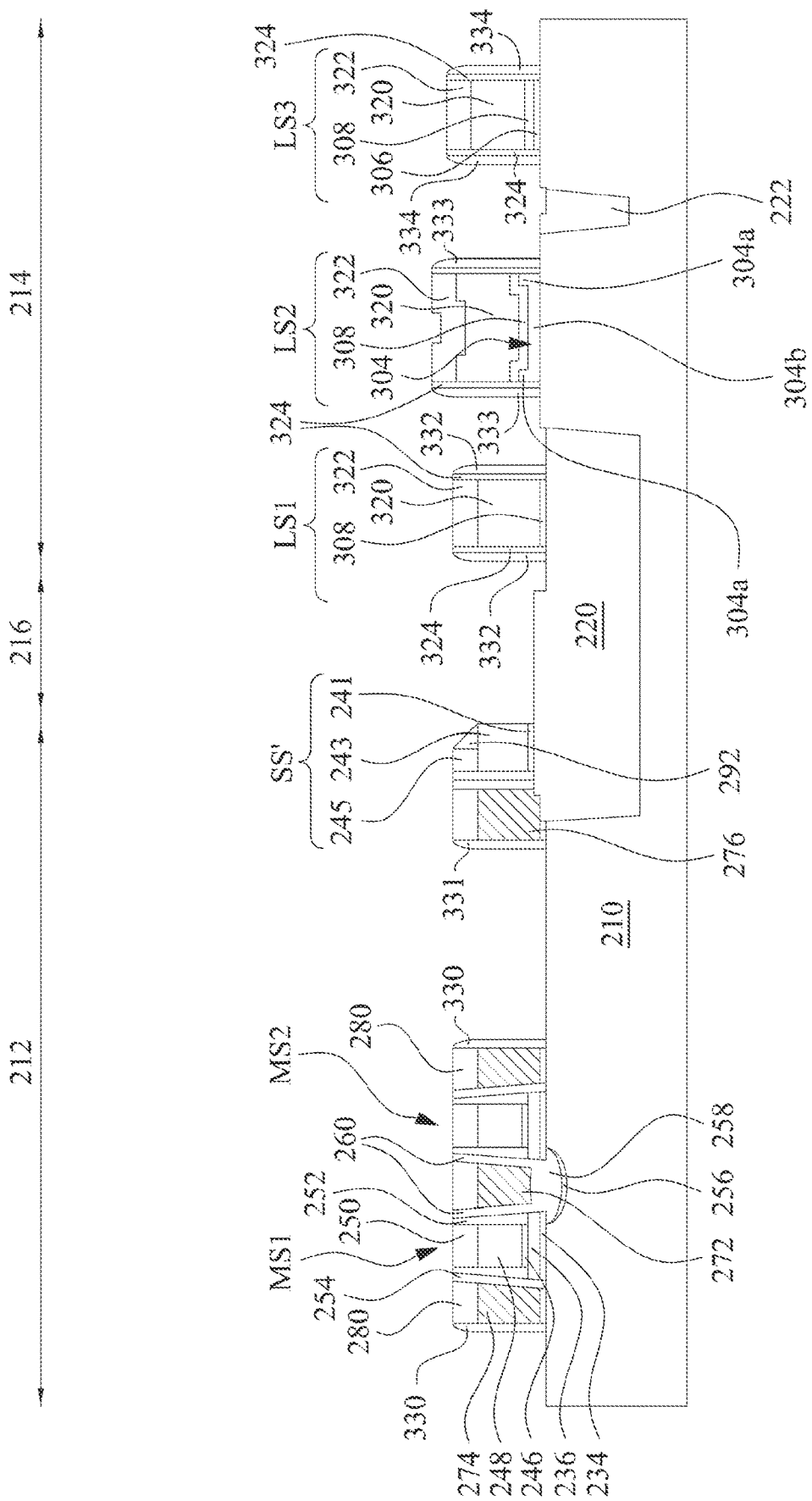

Referring to FIG. 24, the protective layer 292 is removed, such that the gate stacks MS1 and MS2 as well as the stack SS' are exposed. Herein, one or more suitable etching processes are performed to remove the protective layer 292. In some embodiments, a portion of the protective layer 292 may remain on a side of the stack SS'. In some embodiments, after the etching processes, sidewalls of the select gates 274 and the dummy gate 276 are exposed.

Referring to FIG. 1C and FIG. 24, the method 100 proceeds to operation 146 where spacers 330, 331, 332, 333 and 334 are respectively formed on at least one sidewall of the gate stacks and the dummy gate stacks. In the embodiment of FIG. 24, the spacers 330 are formed on the sidewalls of the select gates 274 away from the gate stacks MS1 and MS2. The spacer 331 is formed on a sidewall of the dummy gate 276 away from the stack SS'. The spacers 332 are formed on opposite sidewalls of the gate stack LS1. The spacers 333 are formed on opposite sidewalls of the gate stack LS2. The spacers 334 are formed on opposite sidewalls of the gate stack LS3.

For example, a dielectric spacer layer may be conformally formed over the structure of FIG. 23 after the protective layer 292 is removed, and an etching process (e.g. anisotropic etching process) is performed to remove horizontal portions of the dielectric spacer layer, and vertical portions of the dielectric spacer layer remain to form the spacers 330, 331, 332, 333, and 334. The spacers 330, 331, 332, 333, and 334 may be made of silicon nitride, silicon oxide, and/or other dielectric materials, or the combinations thereof.

Figure 25:
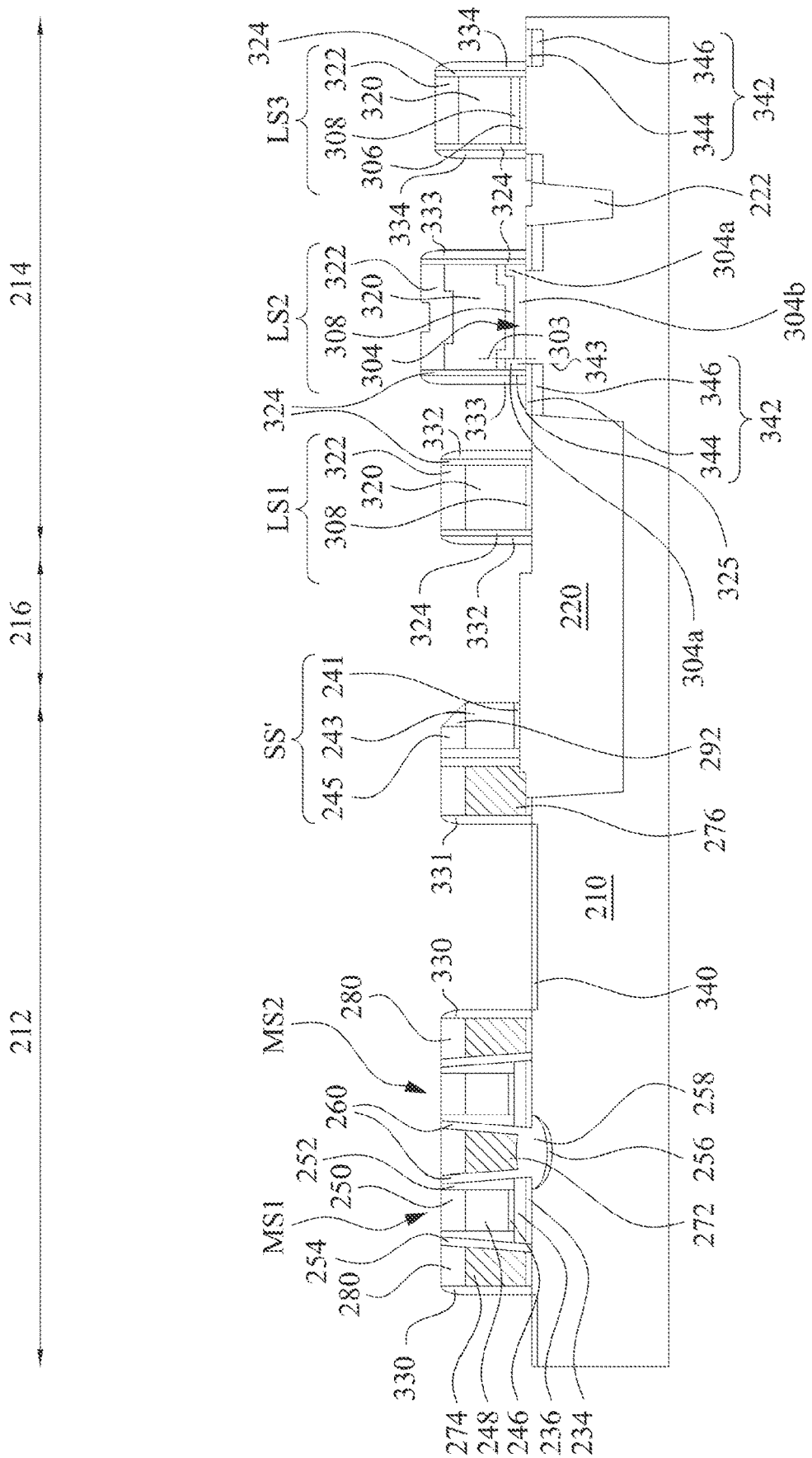

Referring to FIG. 1C and FIG. 25, the method 100 proceeds to operation 148 where drain regions 340 are formed in the cell region 212, and source and drain (S/D) regions 342 are formed in the peripheral region 214. In some embodiments, the drain regions 340 and the source/drain regions 342 are formed by performing an ion implantation process to the semiconductor substrate 210. The select gates 274 and the dummy gate 276 are protected by the spacers 330 and 331 during the ion implantation process. The dummy gate stacks LS2 and LS3 are protected by the spacers 333 and 334 during the ion implantation process. In some embodiments, the S/D regions 342 is formed on the opposite two sides of the dummy gate stacks LS2 and LS3, and the S/D regions 342 may further include a doping region 344 and a doping region 346 underlying the doping region 344. In certain embodiments, the doping regions 344 and 346 may have different dopant concentrations. In some embodiments, an annealing process may be further performed, such that the dopants can diffuse to proper depth and width. For example, the dopants diffuse, so that the source/drain region 342 overlaps with the edge portions 304a of the concave dielectric layer 304. In some embodiments, the source/drain regions 342 do not extend over an interface 303 between the middle portion 304b and one of the edge portions 304a, such that the GIDL may be reduced. In certain embodiments, an interface 343 of one of the source/drain regions 342 and the semiconductor substrate 210 is located between an interface 325 and an interface 303, in which the interface 325 is defined by one of the edge portions 304a and the seal layer 324, and the interface 303 is defined by one of the edge portions 304a and the middle portion 304b. In some embodiments, an silicide layer (not shown) is formed on the drain regions 340 and the S/D regions 342 using for example, reacting metal with the drain regions 340 and the source/drain regions 342, followed by an annealing process.

Figure 1D:
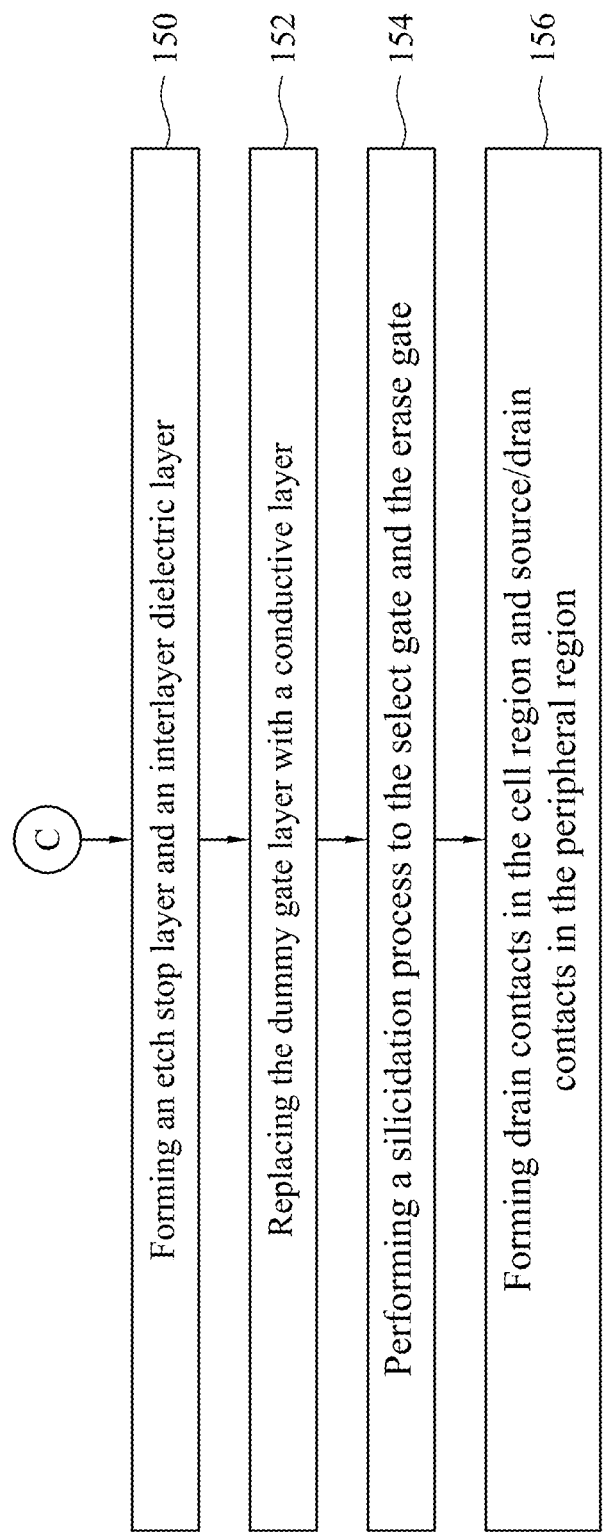
Figure 26:
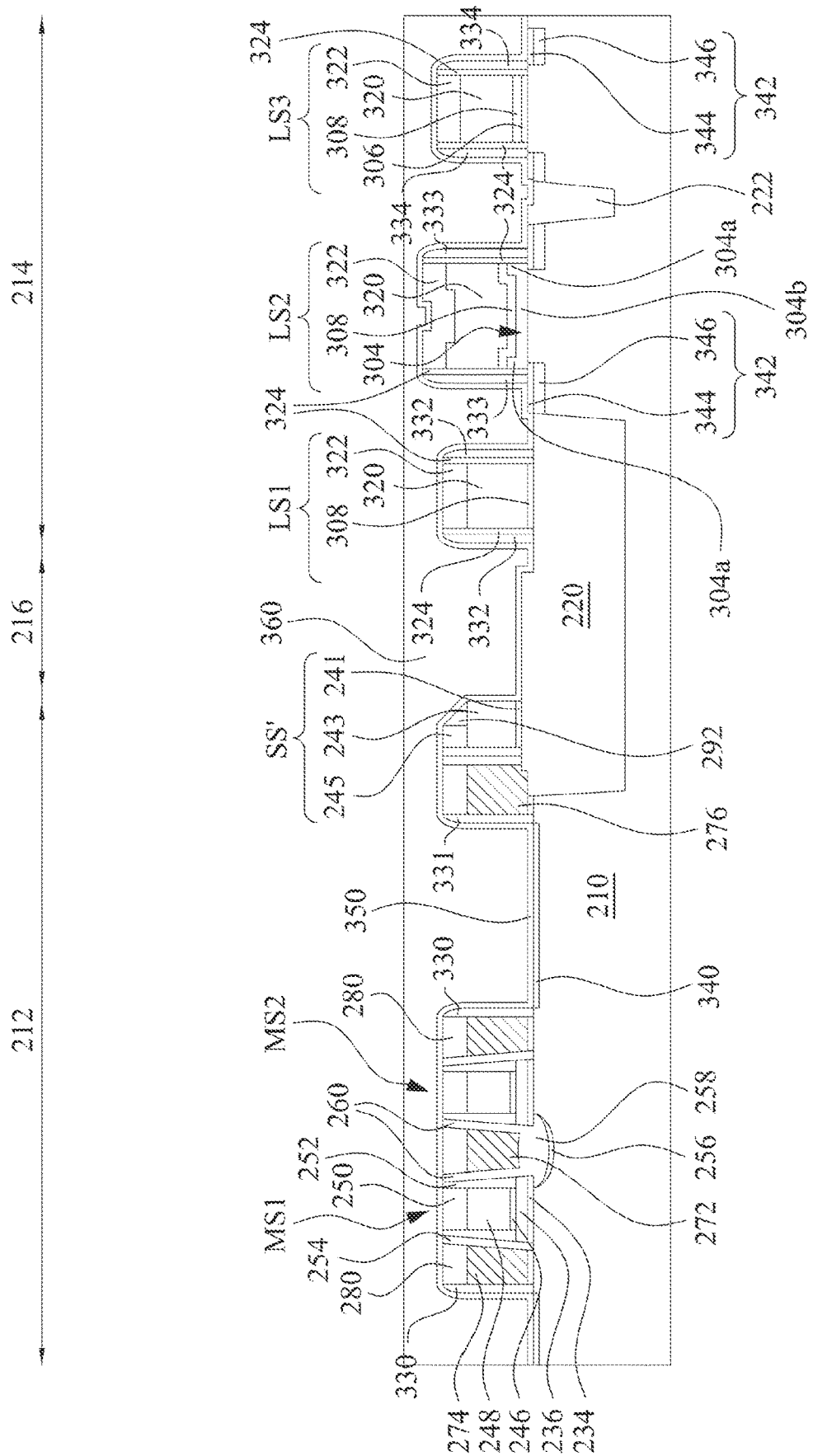

Referring to FIG. 1D and FIG. 26, the method 100 proceeds to operation 150 where an etch stop layer 350 is conformally formed over the gate stack MS1, MS2, the stack SS', the dummy gate stack LS1, LS2 and LS3, and an interlayer dielectric (ILD) 360 is formed over the etching stop layer 350. The etch stop layer 350 is, for example, a nitrogen-containing layer or a carbon-containing layer, such as SiN, SiC or SiCN. The ILD 360 can contain one or more than one dielectric layers, which may be formed by a chemical vapor deposition (CVD) process, a spin coating process, or other suitable process that can form any dielectric materials. The ILD 360 includes, for example, an extreme low-K dielectric (i.e., a dielectric with a dielectric constant κ less than 2).

Figure 27:
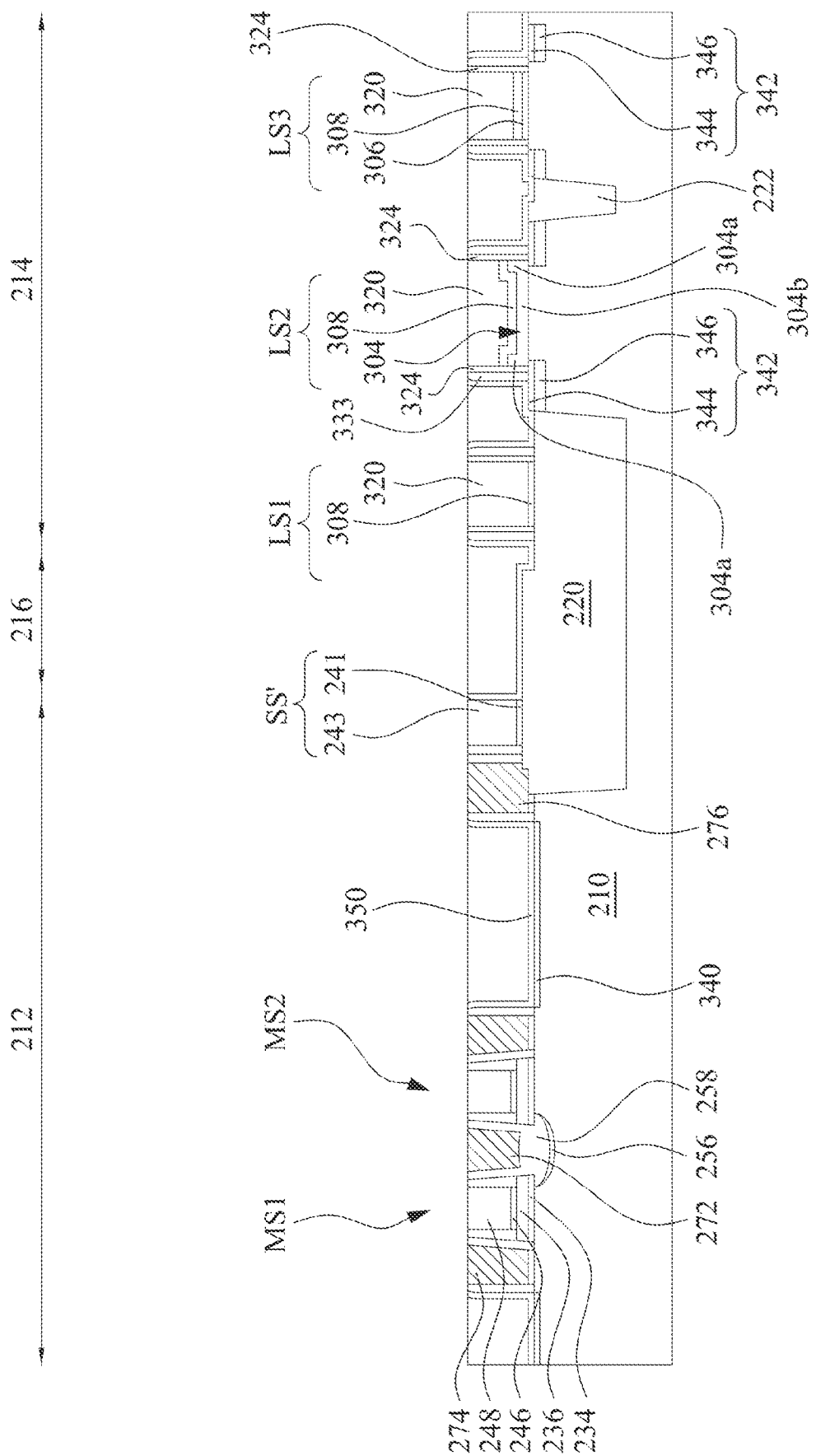

Referring to FIG. 26 and FIG. 27, a planarization process is then performed to remove a portion of the ILD layer 360, a horizontal portion of the etch stop layer 350 formed on the gate stack MS1, MS2, the stack SS', the dummy gate stack LS1, LS2 and LS3, the hard mask layers 245, 250 and 322 and the remaining portion of the protective layer 292. After the planarization process is performed, the erase gate 272, the select gates 274 and the dummy gate 276 in the cell region 212, and the dummy gate layers 320 of the dummy gate stacks LS1, LS2 and LS3 in the peripheral region 214 are exposed. In the embodiments of FIG. 27, the dummy gate layer 320 of the dummy gate stack LS2 is also planarized, such that the top surface of the dummy gate layer 320 is substantially flat after the planarization process is performed.

Figure 28:
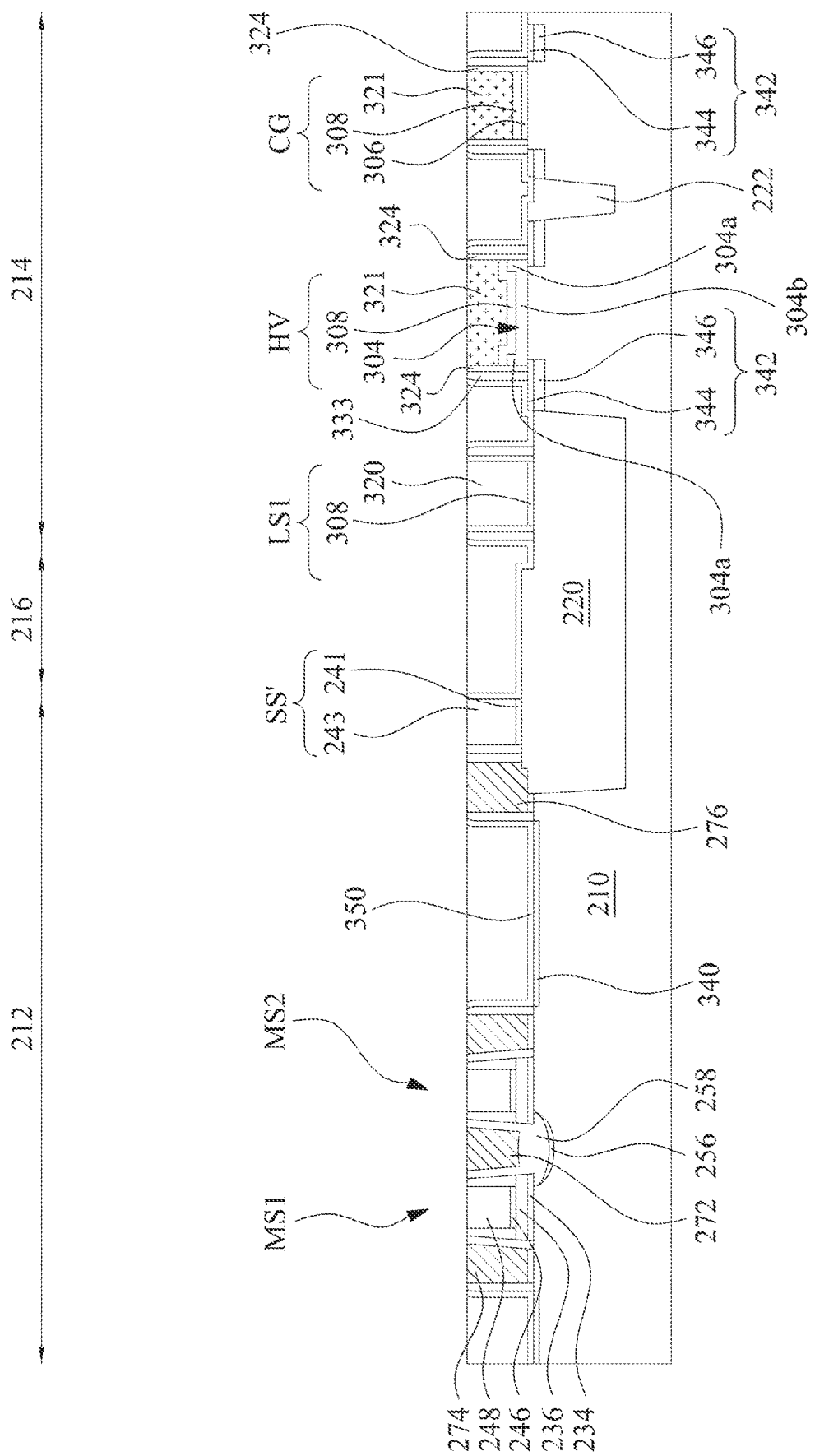

Referring to FIG. 1D, FIG. 27 and FIG. 28, the method 100 proceeds to operation 152 where the dummy gate layers 320 of the dummy gate stacks LS2 and LS3 are respectively replaced with conductive layers 321, thereby forming a high voltage gate stack HV and a core gate stack CG. In some embodiments, replacing the dummy gate layers 320 into the conductive layers 321 is performed using a replacement gate process (RGP), and the conductive layers 321 may be metal layers. For example, the dummy gate layers 320 of the dummy gate stacks LS2 and LS3 (referring to FIG. 27) are removed, such that a gate trench is formed between the spacers 333, and a gate trench is formed between the spacers 334. Then, a metal layer overfills the gate trenches, and a CMP process is performed to remove an excess portion of the metal layer outside the gate trenches. Through the operation, gate metals (or the conductive layers) 321 are formed. In some embodiments, the dummy gate layer 320 of the dummy gate stack LS1 remains, so as to provide isolation between the cell region 212 and the peripheral region 214.

Figure 29:
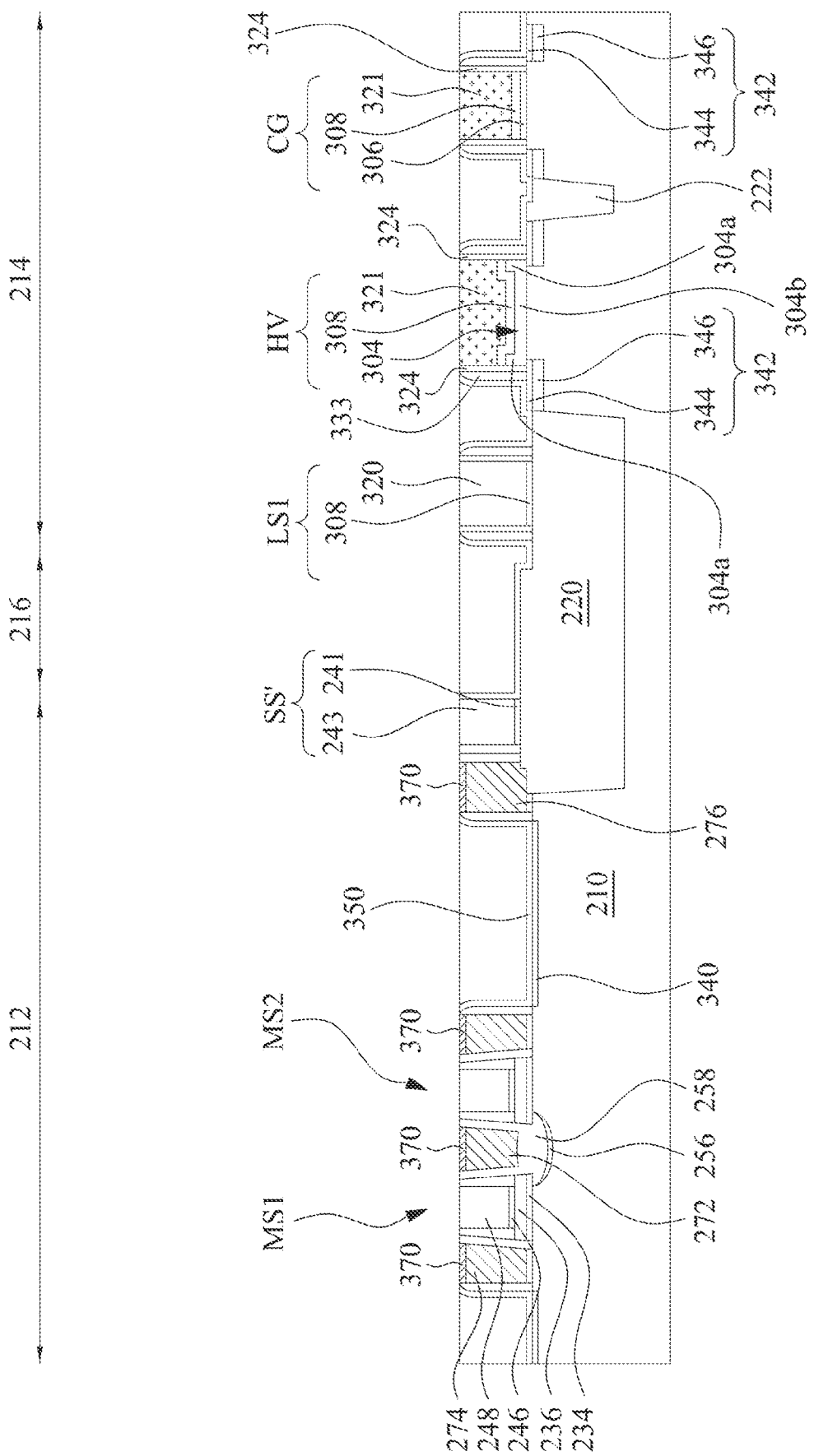

Referring to FIG. 1D and FIG. 29, the method 100 proceeds to operation 154 where a silicidation process is performed to the exposed top surface of the select gates 274, the exposed top surface of the erase gate 272, and the exposed top surface of the dummy gate 276, such that silicide portions 370 are formed adjacent to the top surfaces of the erase gate 272, the select gates 274, and the dummy gate 276. Herein, a mask layer (not shown) may be formed over the top surfaces of the gate stacks MS1, MS2, the stack SS', the dummy gate stack LS1, the high voltage gate stack HV and the core gate stack CG, so as to protect the stacks MS1, MS2, SS', LS1, HV, and CG from silicidation.

Figure 30:
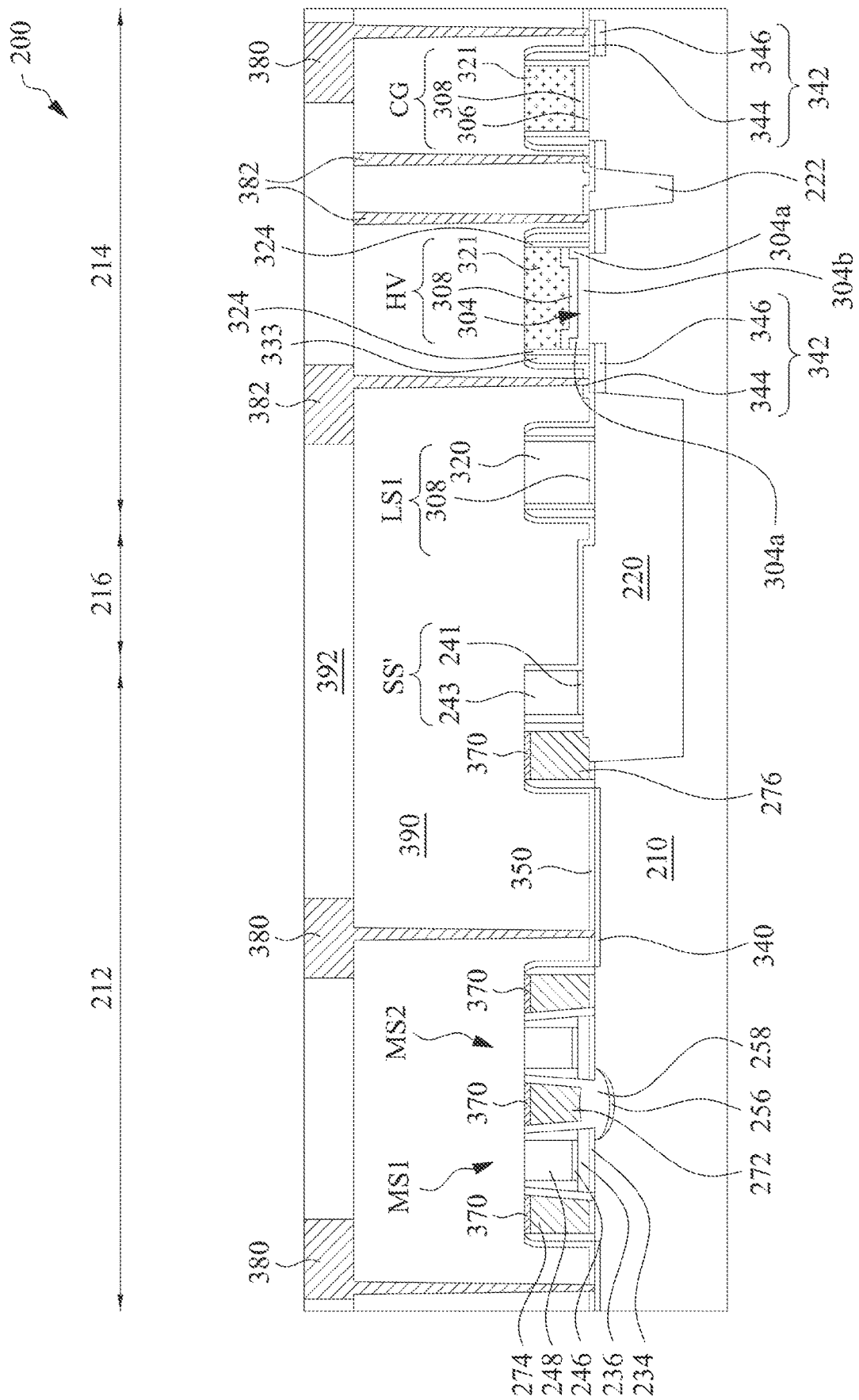

Referring to FIG. 1D and FIG. 30, the method 100 proceeds to operation 156 where drain contacts 380 and source/drain contacts 382 are formed. ILD layers 390 and 392 are formed over the structure of FIG. 29, and then an etching process is performed to form holes to expose the drain regions 340 and the source/drain regions 342. A metal layer may fill the holes, and an excess portion of the metal layer outside the holes are removed by suitable etching or planarization process, such that the drain contacts 380 connecting the drain regions 340 and the source/drain contacts 382 respectively connecting the source/drain regions 342 are formed. A semiconductor device 200 is provided in FIG. 30, in which the high voltage gate stack HV has the concave gate dielectric layer 304. Furthermore, a sum of thicknesses of one or more dielectric layers (e.g., the concave dielectric layer 304 and the high-k dielectric layer 308) of the high voltage gate stack HV is greater than a sum of thicknesses of one or more dielectric layers (e.g., the interfacial layer 306 and the high-k dielectric layer 308) of the core gate stack CG. An operating voltage of the high voltage gate stack HV is greater than the core gate stack CG, and thus it is necessary for the high voltage gate stack HV to have a thicker dielectric layer(s). The thin dielectric layer of the core gate stack is advantageous for obtaining a strong $I_{dsat}$. In addition, when dielectric layer(s) is thicker at the edge portion 304a of the high voltage gate stack HV than the middle portion 304b of the high voltage gate stack HV, the problem of GIDL can be improved while the satisfactory $I_{dsat}$ of the high voltage gate stack HV remains, leading to sufficient performance and reliability of the high voltage gate stack HV.

Figure 31A:
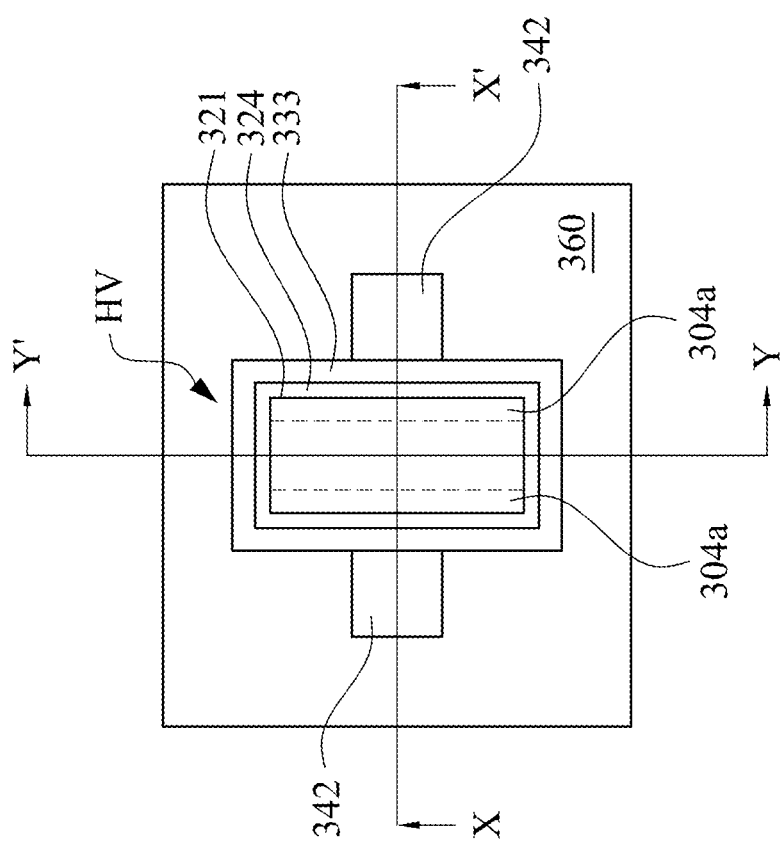
FIG. 31A is a schematic top view of a high voltage gate stack showing an intermediate stage before a contact structure is formed in accordance with some embodiments of the present disclosure.
Figures 31B, 31C:
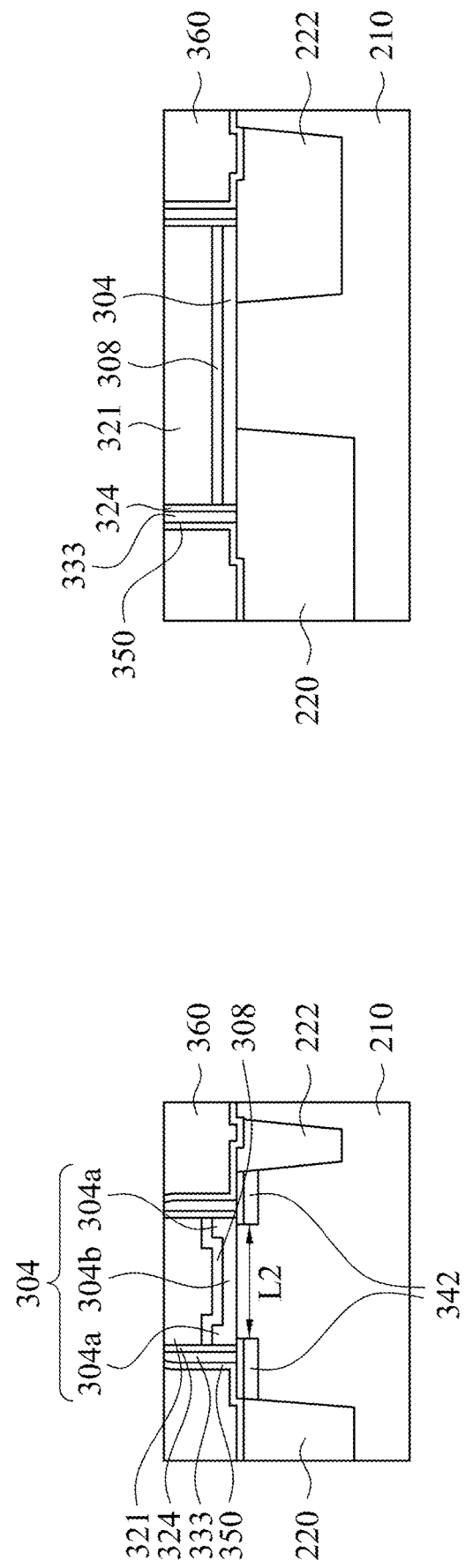
FIG. 31B is a schematic cross-sectional view of FIG. 31A viewed from a cut line X-X'.
FIG. 31C is as schematic cross-sectional view of FIG. 31A viewed from a cut line Y-Y'.

Reference is made to FIG. 31A through FIG. 31C. FIG. 31A is a schematic top view of a high voltage gate stack showing an intermediate stage before a contact structure (e.g., a structure of FIG. 29) is formed in accordance with some embodiments of the present disclosure. FIG. 31B is a schematic cross-sectional view of FIG. 31A viewed from a cut line X-X'. FIG. 31C is as schematic cross-sectional view of FIG. 31A viewed from a cut line Y-Y'. In FIG. 31A through FIG. 31C, elements the same as those shown in FIG. 29 are labelled with the same reference numbers. As shown in FIG. 31A where the high voltage gate stack HV is viewed from top, the high voltage gate stack HV has the conductive layer 321 that is peripherally surrounded by the seal layer 324 and the spacers 333 in sequence. The source/drain regions 342 are on two opposite sides of the conductive layer 321. The etch stop layer 350 shown in FIG. 29 covers the source/drain regions 342, the seal layer 324 and the spacers 333 and exposes the conductive layer 321 for the subsequent contact formation; however, the etch stop layer 350 is not illustrated in FIG. 31A for clear understanding. In the embodiment of FIG. 31A, dotted line regions are used to indicate the edge portions 304a each of which has a greater thickness than its adjacent middle portion (e.g., 304b of FIG. 30), though the structure of the concave dielectric layer 304 is indeed cannot be seen in this top view. As shown in FIG. 31A, the edge portions 304a are configured to extend along a cut line Y-Y'.

Further illustrations for the edge portions 304a are described with reference to FIG. 31B and FIG. 31C. When the high voltage gate stack HV is viewed from the cut line X-X', similar to the structure of FIG. 29, each of the edge portions 304a has a thickness greater than the thickness of the middle portion 304b between these two edge portions 304a, causing a concave profile of the dielectric layer 304. However, when the high voltage gate stack HV is viewed from the cut line Y-Y', the dielectric layer 304 has a flat topography because edge portions extending along the X-X' cut line are not thickened. Furthermore, portions of the isolation features 220 and 222 may have top surfaces that are lower than top surfaces of the other portions of the isolation features 220 and 222 when the gate stack HV is viewed from the cut line X-X', and it is resulted from the removal of a portion of the first dielectric layer 300 (referred to FIG. 16 to FIG. 22) over the isolation features 220 and 222. The top surfaces of the isolation features 220 and 222 are entirely recessed when the gate stack HV is viewed from the cut line Y-Y', and it is resulted from the removal of the first dielectric layer 300 over these portions of the isolation features 220 and 222. In some embodiments, an interface of the source/drain regions 342 and the semiconductor substrate 210 overlaps with the edge portions 304 having the greater thickness. This overlap is advantageous to provide a proper $I_{dsat}$ of the high voltage gate stack HV and reduce the GIDL, so as to improve the reliability of the high voltage gate stack HV. The configuration of the edge portions 304a and the source/drain regions 342 may be similar to the configuration of FIG. 25.

Figure 32A:
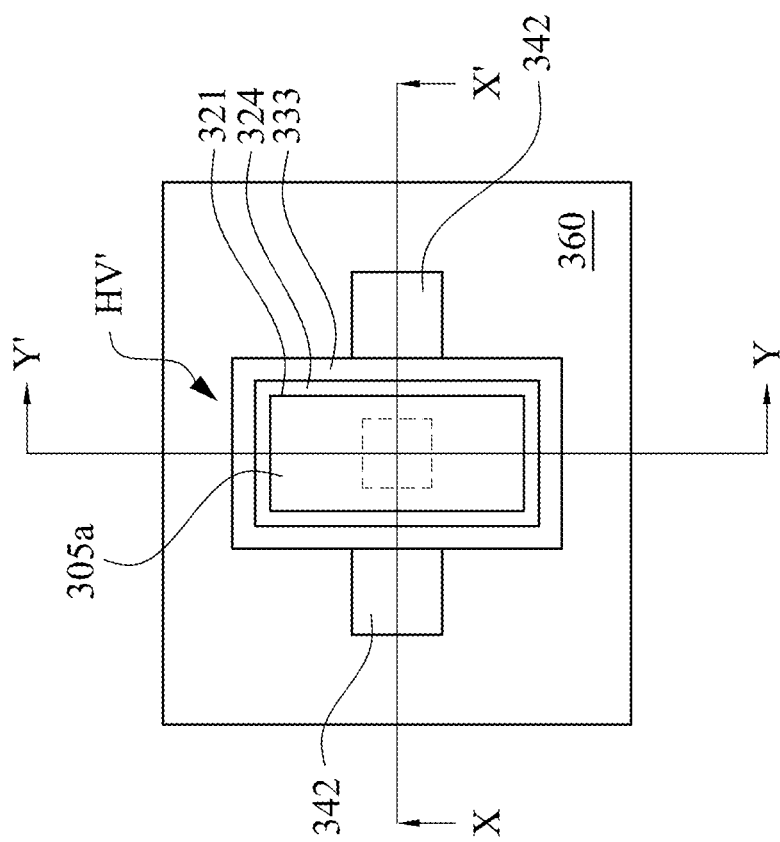
FIG. 32A is a schematic top view of a high voltage gate stack showing an intermediate stage before a contact structure is formed in accordance with other embodiments of the present disclosure.
Figure 32C:
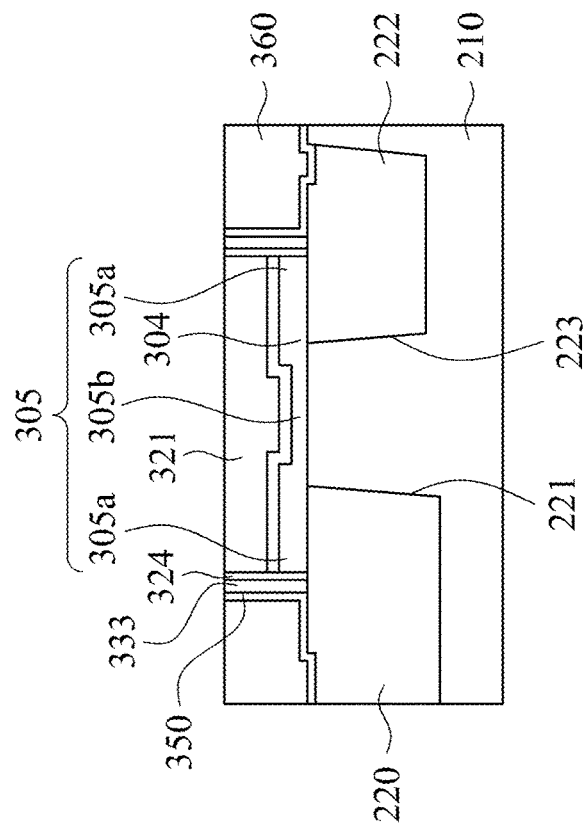
FIG. 32C is as schematic cross-sectional view of FIG. 32A viewed from a cut line Y-Y'.
Figure 32B:
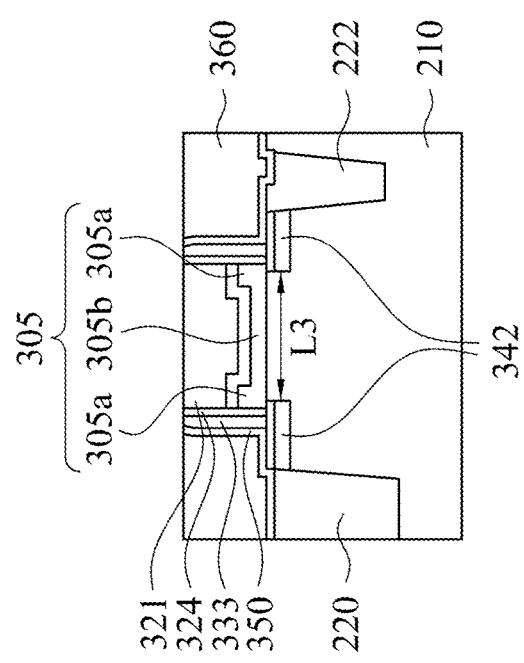
FIG. 32B is a schematic cross-sectional view of FIG. 32A viewed from a cut line X-X'.

Reference is made to FIG. 32A through FIG. 32C. FIG. 32A is a schematic top view of a high voltage gate stack showing an intermediate stage before a contact structure (e.g., a structure of FIG. 29) is formed in accordance with other embodiments of the present disclosure. FIG. 32B is a schematic cross-sectional view of FIG. 32A viewed from a cut line X-X'. FIG. 32C is as schematic cross-sectional view of FIG. 32A viewed from a cut line Y-Y'. In FIG. 32A through FIG. 32C, elements the same as those shown in FIG. 29 are labelled with the same reference numbers. When the high voltage gate stack HV is viewed from top, the high voltage gate stack HV has the conductive layer 321 that is peripherally surrounded by the seal layer 324 and the spacers 333 in sequence. The source/drain regions 342 are on two opposite sides of the conductive layer 321. The etch stop layer 350 shown in FIG. 29 covers the source/drain regions 342, the seal layer 324 and the spacers 333 and exposes the conductive layer 321 for the subsequent contact formation; however, the etch stop layer 350 is not illustrated in FIG. 32A for clear understanding. In the embodiment of FIG. 32A, dotted line regions are used to indicate an edge portion 305a having a greater thickness than its adjacent middle portion 305b, though the structure of the dielectric layer is indeed cannot be seen in this top view. As shown in FIG. 32A, the edge portion 305a peripherally surrounds the middle portion 305b. In other words, the edge portion 305a is formed along a rim of the conductive layer 321.

The structure of FIG. 32B is similar to the structure of FIG. 31B, and may not be repeated herein. In the embodiments of FIG. 32A through FIG. 32C, compared to the structure of FIG. 31C, the edge portion 305a on shorter sides of the high voltage gate stack HV' is additionally formed, such that an interface 221 between the semiconductor substrate 200 and the isolation feature 220, and an interface 223 between the semiconductor substrate 200 and the isolation feature 222 respectively overlap with the edge portions 305a. Another concave profile is formed when the high voltage gate stack HV' is viewed from the cut line Y-Y'. The method for forming the edge portion 305a is similar to the method for forming the edge portions 304a with reference to FIG. 16 through FIG. 22, in which a mask having the same pattern as the top view (FIG. 32A) of the edge portion 305a may be used for etching the dielectric layer (e.g., the first dielectric layer 300 of FIG. 16). Similarly, portions of the isolation features 220 and 222 may have top surfaces that are lower than top surfaces of the other portions of the isolation features 220 and 222 in both FIG. 32B and FIG. 32C. The recessed top surfaces of the isolation features 220 and 222 are caused by the process for forming the concave dielectric layer 304. When the dielectric layer formed on the interfaces 221 and 223 has insufficient thickness, unsatisfactory reliability of the dielectric layer on the interfaces 221 and 223 may not be achieved. The formation of the edge portion 305a may improve the reliability of the dielectric layer near the interfaces 221 and 223.

Similar to FIG. 31B, the source/drain regions 342 overlap with the edge portions 305a having the greater thickness. This overlap is advantageous to provide a proper $I_{dsat}$ of the high voltage gate stack HV' and reduce the GIDL, so as to improve the reliability of the high voltage gate stack HV'. The configuration of the edge portions 305a and the source/drain regions 342 may be similar to the configuration of the edge portions 304a and the source/drain regions 342 in FIG. 25.

Figure 33:
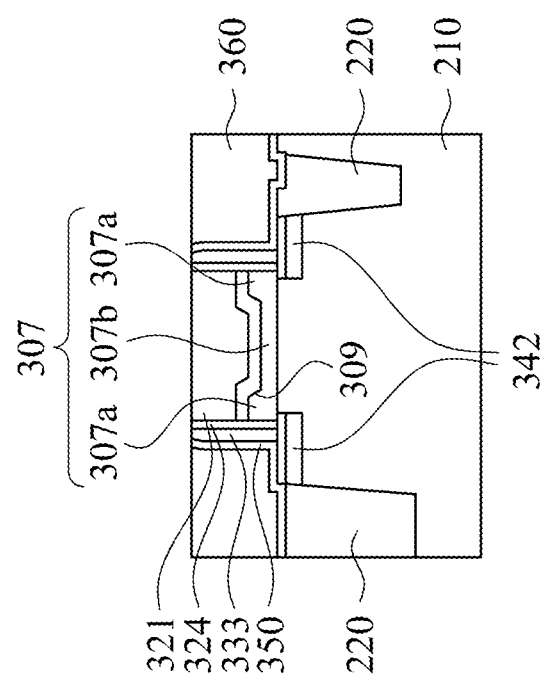
FIG. 33 is a schematic cross-sectional view of a high voltage gate stack in accordance with another embodiment of the present disclosure.

Reference is made to FIG. 33. FIG. 33 is a schematic cross-sectional view of a high voltage gate stack HV" in accordance with another embodiment of the present disclosure. In FIG. 33, elements the same as those shown in FIG. 31B are labelled with the same reference numbers. In the embodiment of FIG. 33, a concave dielectric layer 307 includes edge portions 307a and a middle portion 307b, and each of the edge portions 307a has a tapered surface 309. In certain embodiments, the source/drain regions 342 do not overlap with the middle portion 306b.

A high voltage gate stack having a dielectric layer with thicker edge portions is formed in the peripheral region of the semiconductor device, such that the GIDL may be reduced. Furthermore, the thicker edge portions partially overlap with the source/drain regions, so that the high voltage gate stack may have a proper $I_{dsat}$ and sufficient reliability. In addition, the process for forming such dielectric layer is simple and compatible to the common semiconductor manufacturing process.

In some embodiments, a semiconductor device is provided. The semiconductor device includes a semiconductor substrate and a first gate stack. An isolation feature is formed in the semiconductor substrate, and a cell region and a peripheral region adjacent to the cell region are defined in the semiconductor substrate. The first gate stack is disposed on the peripheral region of the semiconductor substrate. The first gate stack includes a first dielectric layer and a gate electrode layer disposed on the first dielectric layer and covering a top surface of the first dielectric layer. The first dielectric layer is disposed on the semiconductor substrate and has a concave profile.

In some embodiments, a semiconductor device is provided. The semiconductor device includes a semiconductor substrate and a first gate stack. An isolation feature is formed in the semiconductor substrate, and a cell region and a peripheral region adjacent to the cell region are defined in the semiconductor substrate. The first gate stack is disposed on the peripheral region of the semiconductor substrate. The first gate stack includes a first dielectric layer and a gate electrode layer disposed on the first dielectric layer. The first dielectric layer is composed of a first portion, a second portion and a third portion between the first portion and the second portion, and top surfaces of the first and second portions are both higher than a top surface of the third portion. A bottom surface of the gate electrode layer is higher than the top surfaces of the first and second portions.

In some embodiments, a method is provided. The method includes the following operations. First, an isolation feature is formed in a semiconductor substrate, in which a first region and a second region are defined on two opposite sides of the isolation feature. Then, a first dielectric layer is formed over the semiconductor substrate. Next, a first portion of the first dielectric layer is removed, such that a second portion and a third portion of the first dielectric layer remain on the first region, and a portion of the semiconductor substrate is exposed from the second and third portions. Afterwards, a second dielectric layer is formed over the semiconductor substrate to cover the second and third portions. Then, a dummy gate layer is formed on the second dielectric layer. Next, the dummy gate layer, the second dielectric layer and the first dielectric layer are patterned to form a first gate stack in the first region and a second gate stack in the second region. Afterwards, the dummy gate layer is replaced with a conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an isolation feature in a semiconductor substrate;
    depositing a first dielectric layer over and in contact with the semiconductor substrate;
    patterning the first dielectric layer to form a first dielectric material over a first portion of the isolation feature and a first portion of the semiconductor substrate at a first side of the isolation feature and a second dielectric material over the first portion of the semiconductor substrate at the first side of the isolation feature and spaced apart from the first dielectric material, recess a second portion of the isolation feature, and expose a second portion of the semiconductor substrate at a second side of the isolation feature, wherein the first and second sides are at opposite sides of the isolation feature, the second portion of the isolation feature is recessed during patterning the first dielectric layer, and the first portion of the isolation feature is between the second portion of the isolation feature and the first portion of the semiconductor substrate;
    depositing a second dielectric layer over the semiconductor substrate;
    patterning the second dielectric layer, such that the first and second dielectric materials and the patterned second dielectric layer are defined as a concave dielectric layer, and the second portion of the semiconductor substrate and recessed second portion of the isolation feature are exposed from the second dielectric layer;
    forming an interfacial layer over the semiconductor substrate;
    forming a high-k dielectric layer over the interfacial layer;
    depositing a dummy gate layer over the high-k dielectric layer;
    patterning the dummy gate layer, the high-k dielectric layer, the interfacial layer, and the concave dielectric layer to form a first gate stack over the first portion of the semiconductor substrate and a second gate stack over the second portion of the semiconductor substrate; and
    replacing the patterned dummy gate layer with a conductive layer.

2. The method of claim 1, wherein depositing the dummy gate layer is performed such that a bottom surface of the dummy gate layer over the first dielectric material is higher than a bottom surface of the dummy gate layer over the recessed second portion of the isolation feature.

3. The method of claim 1, wherein after patterning the dummy gate layer, the high-k dielectric layer, the interfacial layer, and the concave dielectric layer, a top surface of the first portion of the isolation feature exposed by the first dielectric material is higher than a top surface of the second portion of the isolation feature.

4. The method of claim 1, wherein depositing the second dielectric layer is performed such that the second dielectric layer has a concave profile between the first and second dielectric materials.

5. The method of claim 1, wherein depositing the dummy gate layer is performed such that the dummy gate layer has a concave top portion between the first and second dielectric materials.

6. A method, comprising:
    forming an isolation feature in a semiconductor substrate, wherein a first region and a second region in a peripheral region of the semiconductor substrate are defined on two opposite sides of the isolation feature;
    forming a first dielectric layer over the first region and the second region of the semiconductor substrate;
    removing a first portion of the first dielectric layer over a first portion of the first region of the semiconductor substrate and a second portion of the first dielectric layer over the second region of the semiconductor substrate, such that a third portion and a fourth portion of the first dielectric layer remain on the first region, and the second region of the semiconductor substrate and a first portion of the isolation feature abutting the second region are exposed from the third and fourth portions of the first dielectric layer, wherein the fourth portion of the first dielectric layer is in contact with a second portion of the semiconductor substrate in the first region and a second portion of the isolation feature abutting the first region but spaced apart from a top surface of the first portion of the isolation feature abutting the second region;
    after removing the first and second portions of the first dielectric layer, forming a second dielectric layer over the first region and the second region of the semiconductor substrate to cover the third and fourth portions of the first dielectric layer;
    forming a dummy gate layer on a first portion of the second dielectric layer;
    patterning the dummy gate layer, the second dielectric layer and the first dielectric layer to form a first gate stack over the first region and a second gate stack over the second region;
    replacing the dummy gate layer with a conductive layer;
    prior to forming the dummy gate layer, removing a second portion of the second dielectric layer over the second region;
    after removing the second portion of the second dielectric layer, forming an interfacial layer over the second region; and
    forming a third dielectric layer over the semiconductor substrate and in contact with the first portion of the second dielectric layer.

7. The method of claim 6, wherein removing the first portion and the second portion of the first dielectric layer comprises recessing the first portion of the isolation feature abutting the second region, such that a top surface of the second portion of the isolation feature abutting the first region is higher than the top surface of the first portion of the isolation feature abutting the second region.

8. The method of claim 6, further comprising:
    prior to replacing the dummy gate layer, forming first source/drain regions on two opposite sides of the first gate stack, and forming second source/drain regions on two opposite sides of the second gate stack, wherein the first source/drain regions respectively overlap with the third portion and the fourth portion of the first dielectric layer.

9. The method of claim 6, wherein forming the second dielectric layer comprises conformally depositing the second dielectric layer, such that the second dielectric layer has a concave profile between the third and fourth portions of the first dielectric layer.

10. The method of claim 9, wherein forming the dummy gate layer comprises forming the dummy gate layer having a concave top portion.

11. The method of claim 10, further comprising:
performing a planarization process to remove the concave top portion of the dummy gate layer prior to replacing the dummy gate layer, such that the dummy gate layer has a flat top surface.

12. The method of claim 6, wherein a material of the second dielectric layer is different from a material of the third dielectric layer.

13. The method of claim 6, wherein the second dielectric layer is in contact with opposite sidewalls of the third portion of the first dielectric layer and opposite sidewalls of the fourth portion of the first dielectric layer.

14. A method, comprising:
forming an isolation region in a semiconductor substrate to define a cell region and a peripheral region in the semiconductor substrate, and an isolation feature in the peripheral region;
forming a gate stack of a memory cell over the cell region of the semiconductor substrate;
after forming the gate stack of the memory cell, forming a concave dielectric layer over the peripheral region of the semiconductor substrate, wherein a thickness of an edge portion of the concave dielectric layer is greater than a thickness of a middle portion of the concave dielectric layer, wherein a top surface of the edge portion of the concave dielectric layer is higher than a top surface of a tunneling layer of the gate stack of the memory cell, wherein forming the concave dielectric layer comprises:
forming a first dielectric layer over the semiconductor substrate;
patterning the first dielectric layer, such that an opening is formed in the first dielectric layer, and a first portion and a second portion of the first dielectric layer adjacent to the isolation feature remain, the first and second portions are at a first region of the peripheral region at a first side of the isolation feature, and a second region of the peripheral region at a second side of the isolation feature opposite to the first side is exposed from the first dielectric layer;
forming a second dielectric layer over the first and second regions of the peripheral region to cover the first and second portions of the first dielectric layer and in the opening; and
patterning the second dielectric layer, such that the first and second portions of the first dielectric layer and the patterned second dielectric layer are defined as the concave dielectric layer, and the second region of the peripheral region is exposed from the second dielectric layer;
after forming the concave dielectric layer, forming an interfacial layer over the second region of the peripheral region of the semiconductor substrate;
after forming the interfacial layer, forming a high-k dielectric layer over the interfacial layer, wherein the high-k dielectric layer is in contact with the interfacial layer;
forming a dummy gate layer over the high-k dielectric layer;
patterning the dummy gate layer, the high-k dielectric layer, the interfacial layer, and the concave dielectric layer to form a first gate stack over the first region of the peripheral region and a second gate stack over the second region of the peripheral region; and
replacing the patterned dummy gate layer with a conductive layer.

15. The method of claim 14, wherein forming the second dielectric layer is performed such that the second dielectric layer on the first and second portions of the first dielectric layer has a top surface that is higher than a top surface of the second dielectric layer in the opening.

16. The method of claim 14, further comprising:
forming a spacer on sidewalls of the concave dielectric layer and the patterned high-k dielectric layer.

17. The method of claim 14, further comprising:
forming an etch stop layer over the semiconductor substrate and in contact with the isolation feature after replacing the patterned dummy gate layer with the conductive layer; and
forming an interlayer dielectric over the etch stop layer.

18. The method of claim 14, wherein a top surface of the middle portion of the concave dielectric layer is higher than the top surface of the tunneling layer of the gate stack of the memory cell.

19. The method of claim 14, further comprising:
forming a protective layer over the cell region to cover the gate stack of the memory cell, wherein forming the second dielectric layer is such that the second dielectric layer is in contact with the protection layer.

20. The method of claim 19, wherein patterning the second dielectric layer exposes the protection layer.

* * * * *